(12) United States Patent
Schroeder et al.

(10) Patent No.: US 8,101,846 B1
(45) Date of Patent: Jan. 24, 2012

(54) SOLID STATE THERMOELECTRIC POWER CONVERTER

(75) Inventors: Jon Murray Schroeder, Leander, TX (US); Gerald Philip Hirsch, Clarksville, TN (US)

(73) Assignee: Jon Murray Schroeder, Leander, TX (US)

( * ) Notice: Subject to any disclaimer, the term of this patent is extended or adjusted under 35 U.S.C. 154(b) by 1600 days.

(21) Appl. No.: 11/259,922

(22) Filed: Oct. 28, 2005

Related U.S. Application Data

(63) Continuation-in-part of application No. 10/154,757, filed on May 23, 2002, now abandoned.

(51) Int. Cl.
*H01L 35/00* (2006.01)
*H01L 35/30* (2006.01)

(52) U.S. Cl. ........................ 136/200; 136/205
(58) Field of Classification Search ............... 136/200, 136/205
See application file for complete search history.

(56) References Cited

U.S. PATENT DOCUMENTS

2003/0217766 A1* 11/2003 Schroeder et al. ............ 136/230
2004/0134200 A1* 7/2004 Schroeder et al. ............. 62/3.7

OTHER PUBLICATIONS

Schuster, Rolf, Kirchner, Viola Allongue, Philippe, ERTL, Gerhard, "Electrochemical Micromachining," Science 7, vol. 289, No. 5476, pp. 98-101, Jul. 2000, (publication source and date of above article "Electrochemical Micromachining").
Allongue, P., Jiang, P., Kirchner, V., Trimmer, A.L., Schuster, R., "Electrochemical Micromachining of p-Type Silicon," J. Phys. Chem. B, 108 (38), pp. 14434-14439, Jul. 3, 2004, (publication source and date of above article "Electrochemical Micromachining of p-Type Silicon").

* cited by examiner

*Primary Examiner* — Jennifer K. Michener
*Assistant Examiner* — Dustin Q Dam
(74) *Attorney, Agent, or Firm* — Donald E. Schreiber

(57) ABSTRACT

High efficiency conversion of heat energy to electrical energy is achieved using a ring of metallic components and anodically sliced, reduced barriers, high purity n-type and p-type semiconductor wafers. Energy produced by heating one set of fins and cooling another set is extracted from a ring of bismuth telluride based n-type wafers and antimony telluride based p-type wafers using make-before-break control of MOSfet switch banks. Standard AC frequencies and DC output result from rectification of make-before-break high frequency switched very high currents in the ring and a DC to AC converter. Solar energy stored in porcelain fragments extends the time that solar energy can be used as the heat source for the thermoelectric generator device.

39 Claims, 13 Drawing Sheets

SOLID STATE THERMOELECTRIC POWER CONVERTER

RELATED APPLICATIONS

This application is a continuation-in-part of U.S. patent application Ser. No. 10/154,757, filed May 23, 2002, now abandoned entitled "Torus Semiconductor Thermoelectric Device" published Nov. 27, 2003.

TECHNICAL FIELD

This invention relates to a circular array of semiconductor and conductive elements that comprise a high efficiency thermoelectric generator device. Energy generated by a temperature differential between hot and cold fins of the thermoelectric generator device is more efficiently converted to electrical energy by a combination of both high efficiency semiconductor elements and a high frequency direct current to direct current switching component. When combined with an H-bridge the combination produces alternating current output of various standard voltages and frequencies. Improved cooling efficiency is obtained by increasing the surface area of the cold fins. This is accomplished by splitting and displacing the lower portion of the cold fin. This improved efficiency device is especially suitable for conversion of solar energy to electricity by the use of a porcelain based heat storage system.

BACKGROUND ART

Thermoelectric generator devices have been used for many years for specific applications where the simplicity of design warrants their use despite low energy conversion efficiency.

The voltage produced by a thermoelectric generator device depends on the Seebeck voltage of the dissimilar metals used. Seebeck voltages are higher for some semiconductor materials especially n-type and p-type elements made primarily of mixtures of bismuth, tellurium, selenium and antimony.

To compete with more traditional forms of heat to electricity conversion thermoelectric generator devices must be as efficient as possible. A preferred means to achieve such high efficiency is to arrange the thermoelectric generator elements in a circle with only a very small region used to extract the energy produced by the thermoelectric generator elements.

Patent PCT/US97/07922 to Schroeder discloses such a circular arrangement. Art teaching in this case focused on 3 means to extract energy for the high current in the ring of elements; 1—a vibrating mechanical switch, 2—a Hall effect generator and 3—a Colpits oscillator. Coatings of hot and cold elements of the thermoelectric generator device are claimed for selenium, tellurium and antimony among others but not for mixtures of these elements.

U.S. Pat. No. 6,222,242 to Konishi, et al. discloses semiconductor material of the formula $AB_2$, $X_4$ where A is one of or a mixture of Pb, Sn, or Ge, B is one of or a mixture of Bi and Sb and X is one of or a mixture of Te and Se. These represent Pb, Sn or Ge doped bismuth telluride.

U.S. Pat. No. 6,274,802 to Fukuda, describes a sintering method of making semiconductor material whose principle components include bismuth, tellurium selenium and antimony.

U.S. Pat. No. 6,340,787 to Simeray discloses a thermoelectric generator component of bismuth doped with antimony and bismuth tellurium doped with selenium wherein said components are arranged into a rod. Very low voltages are converted using a self-oscillating circuit at the expense of power output.

U.S. Pat. No. 6,172,427 describes the use of a thermoelectric generator device on the exhaust portion of a combustion-based car using an electrically driven wheel wherein excess heat energy is converted to electric power for the vehicle.

Published US application 20040134200 to Schroeder, et al., entitled "Torus Semiconductor Thermoelectric Chiller" describes the combination of a semiconductor thermoelectric generator device and absorption chiller to produce refrigeration and facilitate the collection of water from air.

Published U.S. patent application 2003/0217766 to Schroeder, et al. entitled "Torus Semiconductor Thermoelectric Device" describes a circular array of semiconductor elements utilizing individual casting of wafer components.

Wire saws have been used in the semiconductor industry for some time. U.S. Pat. No. 6,283,111 to Kazunori Onizaki, et al., uses a wire saw to cut single silicon crystals and cutting is done by pressing the ingots against the wire. U.S. Pat. No. 6,802,928 to Akira Nakashima utilizes a jig to improve cutting of silicon wafers and cuts by pressing the ingot against the wires.

U.S. Pat. No. 6,617,504 to Takeshi Kajihara, et al., uses a mixture of bismuth telluride and antimony telluride as a semiconductor but doped the mixture with a dopant of p-type or dopant of n-type. The mixtures are made into small globules for particular applications.

U.S. Pat. No. 6,313,392 to Yasunori Sato, et al., teaches the use of $Bi_{1.5}Sb_{0.5}Te_3$ to prepare p-type semiconductors for hot pressing and cold pressing.

U.S. Pat. No. 6,274,802 to Katsushi Fukuda, et al., uses the composition $Bi_{0.4}Sb_{1.6}Te_3$ for p-type semiconductor manufacture.

U.S. Pat. No. 4,855,810 to Allan Gelb, et al., teaches the use of a p-type semiconductor comprising 75 mole percent antimony telluride, 25 mole percent bismuth telluride with 3 percent excess tellurium, and 6.1 percent lead.

SUMMARY OF THE INVENTION

It is a purpose if this invention to provide high conversion efficiency of heat energy to electrical energy by making use of anodically sliced, reduced barriers, n-doped and p-doped semiconductors attached to metal heat-conducting elements in a circular arrangement of thermoelectric generator components.

It is a further purpose of this invention to operate thermoelectric generator devices in high current low resistance mode by increasing electrical conduction in n-doped and p-doped semiconductors using reduced barriers processing.

It is a further purpose of this invention to provide a high efficiency of transmission of energy contained in a thermoelectric torus by an improved make-before-break switching control system utilizing special physical connections to the ring-shaped thermoelectric generator device.

Another purpose of this invention is to provide for the use and storage of solar energy. Excess electrical output energy is stored using resistance heating into a heat store allowing temperatures in the store to be greater than the highest temperature that can be handled by the thermoelectric generator device.

It is a further purpose of this invention to provide a novel method of slicing selenium-bismuth-telluride-based and antimony-bismuth-telluride-based semiconductor wafers from boule castings.

It is a further purpose of this invention to provide a novel composition of bismuth doped diantimonytritelluride suitable for use as a p-type semiconductor element.

It is a further purpose of this invention to provide a means to energize the control board and thereby replace the need for a battery in the device.

It is a further purpose of this invention to improve the efficiency of power conversion by splitting the ends of cold fins and thereby increasing the surface area available for cooling.

Briefly, a high efficiency semiconductor thermoelectric generator device in accordance with the present disclosure includes:
1. a thermoelectric generator component having a plurality of standard coupons;
2. an upconverter component with power takeoffs for removing electrical energy generated from high currents produced in the thermoelectric generator component;
2. a controller component;
4. a DC to DC converter component; and
5. means for holding the coupons in fixed physical relationship to one another.

The high efficiency semiconductor thermoelectric generator device's thermoelectric generator component includes a plurality of standard coupons that are:
1. soldered in registry; and
2. adapted for being held in compression in the form of a ring.

Each standard coupon includes:
1. an anodically sliced, reduced barriers, high purity, p-type, antimony-bismuth-telluride-based semiconductor wafer;
2. a first metallic fin adapted for being cooled;
3. an anodically sliced, reduced barriers, high purity, n-type, selenium-bismuth-telluride-based semiconductor wafer; and
4. a second metallic fin adapted for being heated.

The order in which each standard coupon's components are assembled is consistently the same for all of the thermoelectric generator component's standard coupons.
1. the first cooled metallic fin
2. the n-type semiconductor wafer
3. the second heated metallic fin
4. the p-type semiconductor wafer.

The high efficiency semiconductor thermoelectric generator device's upconverter component removes electrical energy generated from high currents produced in the ring-shaped thermoelectric generator component when:
1. cooling is applied to the first cooled metallic fins; and
2. heat is applied to the second heated metallic fins.

The upconverter component, that is incorporated into the ring-shaped thermoelectric generator component between standard coupons before soldering the ring-shaped thermoelectric generator component, includes two different types of coupons modified from the structure of the standard coupon described above. In comparison with a standard coupon, a first type of modified coupon has one additional straight cooled fin on the opposite end of a standard coupon from the cooled fin thereof. The first type of modified coupon also has a first complementary pair of power takeoff metal laminates fixed to the straight cooled fin. A second type of modified coupon lacks both the standard coupon's cooled fin and the adjacent n-type semiconductor wafer. Instead of these omitted standard coupon components, the second type of modified coupon includes a straight cooled fin that replaces the n-type semiconductor wafer of a standard coupon. The second type of modified coupon's straight cooled fin is soldered to that coupon's heated fin. The straight cooled fin has:
1. a second complementary pair of power takeoff metal laminates fixed thereto; and
2. an n-type semiconductor wafer soldered to the straight cooled fin on a side thereof that is furthest from the immediately adjacent second type of modified coupon's heated fin.

The upconverter component's power takeoff metal laminates that are included in the first and second modified coupons:
1. have one metal laminate of each pair twisted one-hundred eighty degrees) (180° relative to the other metal laminate; and
2. all of the metal laminates are insulated on the exterior and between metal laminates except at the ends thereof furthest from the ring-shaped thermoelectric generator component.

The upconverter component also has an insulator inserted between the first and the second modified coupons before final assembly of the ring-shaped thermoelectric generator component.

The upconverter component also includes metal-oxide-semiconductor field-effect transistor ("MOSfet") switch banks respectively soldered between ends of the first complementary pair's and second complementary pair's power takeoff metal laminates. Soldering the MOSfet switch banks between the power takeoff metal laminates establishes:
1. one twisted single turn closed loop; and
2. one non-twisted single turn closed loop.

The upconverter component also includes a transformer having:
1. an E-core that is encircled both by the twisted single turn closed loop and by the non-twisted single turn closed loop that constitute primary windings of the transformer;
2. several few turn secondary windings; and
3. at least two high multiple-turn secondary windings.

After starting up operation of the high efficiency semiconductor thermoelectric generator device, the device's controller component derives operating energy from one of the low multiple of secondary windings in the E-core transformer. Operation of the controller component drives the MOSfet switch banks utilizing pulse width modulation to produce high frequency switching of the single turn loops by supplying inverted wavforms to the MOSfet switch banks that produce a make-before-break switching format.

The high efficiency semiconductor thermoelectric generator device's DC to DC converter component rectifies voltage produced by the upconverter component's transformer's two high multiple-turn secondary windings to produce DC current therefrom.

Finally, the high efficiency semiconductor thermoelectric generator's means for holding the coupons in fixed physical relationship to one another causes the ring-shaped thermoelectric generator component to become contiguous.

DISCLOSURE OF THE INVENTION

Figure 1:
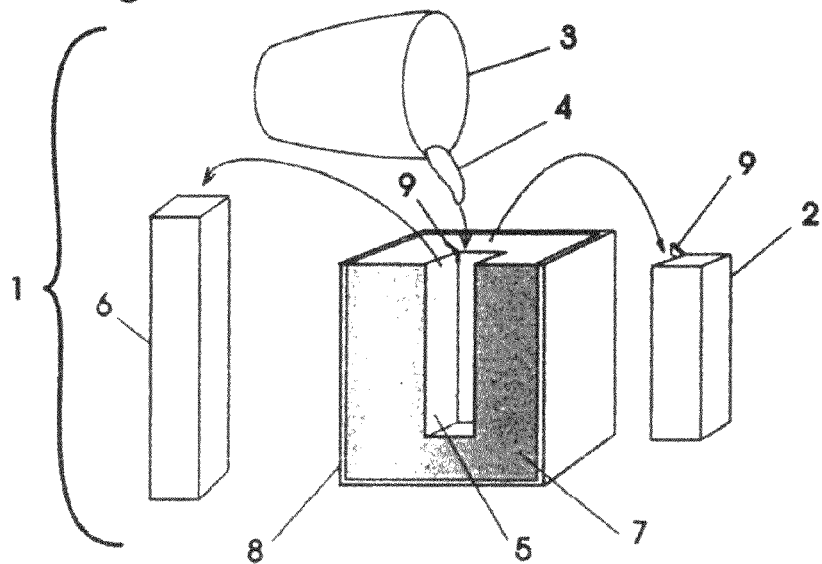
FIG. 1 illustrates a boule casting of reduced barriers semiconductor.

To illustrate this invention figures are drawn to show components of some implementations of the invention. It should be understood that these figures do not in any way limit this invention as describe in the claims.

The invention comprises a heat source, a plurality of thermoelectric coupons arranged in a ring, a means for extracting electrical energy from said ring. Energy is produced in the form of very high currents circling through a plurality of coupons. These currents are induced when metallic hot and cold fins of the thermoelectric coupons are respectfully heated and cooled. The term coupon is used herein to identify the combination of a hot fin, a high purity n-type semiconductor, a cold fin, a high purity p-type semiconductor and a metal wedge. Multiple coupons are assembled to make a ring. The ring conformation is important in reducing losses, that would otherwise occur if a resistive conductor like copper were used to electrically connect ends of a linear array of coupons.

The heat source can be any of a myriad of combustible materials such as gases of hydrogen, methane, ethane, propane, butane, liquids such as gasoline, kerosene or crude oil, and solids such as wood, used tires, straw and other celluloid materials and coal. In addition the heat needed for electricity production can come from concentrated sunlight. A preferred heat source is heat energy stored from collected solar radiation. Waste heat from these and other combustion activities can also be stored and used as needed.

For several means used to generate heat, the hot gasses are passed over the hot fins to heat them. In a preferred embodiment gas or liquid is combusted directly under the hot fins. In a preferred configuration the hot fins project inward with regard to a circle or torus of coupons and the hot air is passed through or combustion occurs adjacent to the hot fins.

In another preferred embodiment the rate of fuel combustion is controlled to match the electrical demand of the thermoelectric device. In the case of gas or liquid being combusted near the hot fins, infrared radiation which passes through or is given off from the hot fins is radiated back on the hot fins by a reflective metallic dome.

In another preferred embodiment a temperature sensor on a cold fin is used to sense temperature above 100 degrees C. and cause an open circuit in a fail-closed valve supplying fuel to the thermoelectric generator device in the event of a cooling blower failure or low cooling air velocity across cold fins.

In another preferred embodiment a temperature sensor on a cold fin is used to sense temperature above 100 degrees C. and cause an open circuit in a blower motor supplying hot air to the thermoelectric generator device in the event of a cooling blower failure or low cooling velocity across cold fins.

In another preferred embodiment a reflective dome has backing of an insulating layer. An opening is made in the top dome to allow hot air to escape or a tube is attached to direct the escaping air.

A unique method is used to extract energy from the high current flowing in the thermoelectric ring without interrupting current flow or the direction of current. An integrated metallic takeoff apparatus is inserted between any two coupons. In a preferred embodiment the takeoff apparatus is made of two takeoffs each having two connections to metal laminates that form connections to two sets of MOSfet switch banks. The first takeoff is made of a special straight cold fin that has been high-temperature-brazed to 2 sets of multiple thin insulated metallic strips each sets of strips forming a laminate. One of the laminates is twisted 180 degrees relative to the other. Both laminates extend out from the ring and are wrapped in circular fashion about secondary coils and an E-core. To accommodate the MOSfet switch banks the end of the takeoffs are folded in the direction away from the ring. These folded sections of the straight and twisted laminates are individually soldered to one of two banks of MOSfet switches. On the opposite side of the MOSfet switch banks are soldered a second complementary set of laminates formed in a manner to extend back to the ring forming a closed current loop. The preferred connection from the complementary laminates utilizes a high temperature soldered modified cold fin. This modified fin is soldered to a coupon from which the original cold fin was removed. As with the takeoffs from said straight cold fin said modified cold fin connects to two sets of multiple thin insulated metallic strips forming a laminate. One of the two laminates is twisted 180 degrees relative to the other. The first set of laminates attached to the straight cold fin and the second set of laminates attached to the modified cold fin are arranged to complement one another in such a manner that when connected to the MOSfet switch banks the 180 degree twisted takeoffs form one closed loop and the straight takeoffs form another.

In a preferred embodiment a shortened cold fin is placed 180 degrees from the additional cold fin to maintain physical symmetry. In this case the upconverter connects to the ring through only cold fins thereby reducing the amount of heat entering the upconverter. Insulating material is placed between the two cold fins of the power takeoff as well as strips forming the laminate and the current loops that conduct current around the upconverter. This insulating material is preferably a thin layer of mica. In addition the insulating material can be a thin layer of room-temperature vulcanizing rubber coated with zirconium or other ceramic beads. Other kinds of insulating non-ceramic beads of same particle size can also be used.

This upconverter assembly provides two current loops in opposite directions around secondary coils and a high frequency E-core. The current flow is determined by the condition of each switch bank.

The power takeoff upconverter is controlled by a circuit board with a pulse width modulator chip driving multiple inverted MOSfet drivers. The inverted MOSfet drivers create a make-before-break mode for current direction through power takeoff loops. Without inversion sharp spikes are produce during the reversal in the secondary because current is interrupted in the ring. By inverting the drives, current in the ring continues to flow and no electromagnetic pulses occur. The number of switch chips employed in parallel is determined by the maximum amount of current generated in the ring and depends on the capacity of the MOSfet switches. For example in a 5-kW thermoelectric generator device ten MOSfet switches in each switch bank safely commutate about 2000 amps.

In addition to the secondary coils that output power from the ring four additional secondary windings supply isolated power for components of a controller circuit board.

In a preferred embodiment power to the controller circuit board at startup is provided by a special component, eliminating the need for a battery to do this task. This component is powered with current from the ring such that when the ring reaches 0.6 volts it provides 12 volt, 100 milliamps output to operate the controller circuit board. The component connects to each side of one of the upconverter switch banks. The output current to the special component declines when MOSfet switch banks become active and voltage drops to zero. A diode bridge of the component prevents power from entering the special component after the controller board becomes powered by secondary power from the E-core upconverter.

A pulse-width modulator chip is used to control the MOSfet switches. If a simple oscillating circuit is used optimum power is not obtained. If the drive of the pulse-width modulator is not overlapping very high spikes of current are induced in the primary and secondary windings of the upconverter. Such spikes would adversely affect electric devices that use the secondary voltage outputs.

Secondary windings in the E-core of the upconverter transformer produce AC output voltages at higher frequency than useful. The number of windings needed depend on the voltage driving the ring and the coupling efficiency of extracting that energy. This number of windings can be determined by those skilled in the electronic arts. For example a ring with 60 coupons can produce 3 volts in the primary to drive 2000 amps and using a 1:40 winding ratio a secondary voltage of approximately 120 volts AC is obtained.

Achieving the proper alternating current energy out of a circle of thermoelectric coupons requires additional special conversion components. Important components involved in the extraction of electrical energy are rectifier bridges to convert high frequency switching DC output into. DC and an H-bridge that converts rectified secondary voltage to the proper 50/60 Hertz alternating current. The waveform produced from the H-bridge is controlled by inputs from a pulse-width modulator.

This thermoelectric generator device is very quiet when running thus providing an opportunity to replace noisy gasoline driven implements and appliances.

To provide these benefits details are given for making and using a simple circular collection of coupons. Each coupon is made by alternating a cold fin, that is, a metal fin to be cooled, a reduced barriers n-type semiconductor, then a hot fin, that is heated, then a p-type reduced barriers semiconductor followed by a metallic wedge component. The wedge allows for the hot fins and cold fins to be rectangular and still be formed into a ring. The wedge also protects the p-type semiconductor in assembly after soldering of the coupons. Use of the wedge allows coupon connections to all be metal to metal in the assembly of the ring. An alternative procedure is to make cold fins tapered or hot fins tapered or both cold and hot fins tapered in the region of contact with the semiconductor wafers.

For clarity of the disclosure and definition of the claims the following terms are defined:

"Semiconductor" means: a mixture of one or more elements that has the property of allowing either electrons or holes to move through the mixture depending on whether the mixture has an excess n-type or p-type doping. The semiconductor nature of thermoelectric wafers is well established in the electronic literature.

"Fin" means: an elongated metal slab optionally straight, tapered, or split on one end, the other end being soldered to an n-type semiconductor and on the other side to a p-type semiconductor and on either side soldered to, a conductive wedge.

"Cold fin" means: a fin to be cooled.

"Hot fin" means: a fin to be heated.

"Coupon" means: a repeating component of the thermoelectric generator device made up of at least one n-type semiconductor, one hot fin, one p-type semiconductor, and one cold fin. In the device having a wedge component with each set of fins and semiconductors a coupon includes the wedge component. A coupon that does not use a wedge component has the hot fin, the cold, fin or both tapered in the region that is adjacent to the n-type or p-type semiconductor.

"Kester's solder" means: Lead-free solder paste consisting of 96.5% tin and 3.5% silver.

"Wafer" means: an n-type or p-type semiconductor made in the shape of thin slab where the thickness of the shortest dimension is from 5% to 20% of the either of the other dimensions. An example is a 40 mil thick piece of semiconductor material 0.75 inches by 0.75 inches that is used to create the Seebeck voltage of the coupons.

"Wafer side" means: the surface area denoted by the larger dimension of a wafer where when placed in the coupon the wafer side becomes the current carrying side.

"Wafer edge" means: the surface area denoted by the smallest dimension of a wafer. Before a wafer is placed in the coupon the wafer edges are coated with insulator to reduce current leakage.

"Upconverter" means: a high frequency transformer controlled by MOSfet switch banks having two single turn loops, one of which has current flowing opposite to the other, an E-core to facilitate high frequency transformer efficiency and multiple secondary windings having a number of turns corresponding to the designed output voltages.

"High purity" means: purity of 99.9% or greater for the components to be combined.

"Boule" means: a mass of semiconductor that is caused to grow with reduced barriers during casting.

"Reduced barriers" means: a semiconductor product showing the property of a single face after a sharp break of a semiconductor wafer and characteristic low resistance in the boule of semiconductor material. In the boule form a Seebeck voltage is greater than 50 millivolts at a 200-degree centigrade temperature differential. Another property of a reduced barriers boule is calculated resistance equal to or less than 0.000006 Ohms determined by measuring voltage along 2 inches of the boule when a 1 amp current is passed along the long axis of the boule.

"Phosphorous nickel" means: An electroless plating product that contains from 1% to 10% of phosphorous combined with nickel.

"Distinct orifice" means: an opening in an enclosure that allows air, gaseous fuel or atomized fuel to pass, exhaust to exit and recycled air or fluid to exit the device. It can be just an opening in a flat or rounded structure or it may be a duct attached to said flat or rounded structure.

"Alternate fin" definition: a fin to be cooled is the alternate of a fin to be heated and conversely.

"Alternate semiconductor" definition: p-type and n-type semiconductors are alternates of one another in coupon assembly.

"Box" definition: The term "box" is used herein to denote an enclosure that can be used to maintain components of the invention in a fixed physical relationship. While a box is not necessary for the invention to be practiced it is a practical feature of the invention. As an example in a preferred embodiment the "box" is made of two serving pans commonly used in a buffet with one inverted over the other.

"Anodic slicing" means: A process of cutting semiconductor matter using only electrolytic dissolution to remove that portion of the matter required to produce a slice of the bulk matter.

Before describing how to produce components of the invention, figures are provided to illustrate a working version. Examples are intended to illustrate the basic principles and elements of the device. Examples are given for a variety of applications but by no means represent the broad applications of this invention.

FIG. 1 illustrates reduced barriers casting set 1 and the product 2, a boule made by this novel crystal growing procedure. The procedure applies to n-type and p-type doped selenium-bismuth-telluride-based and antimony-bismuth-telluride-based semiconductor materials. The growth of reduced barriers semiconductor is achieved by using a crucible 3 to pour combined melted high purity elements 4 into a rectangular mold 5. The mold is prepared by compressing an inert casting matrix 7 around the replica 6, a pilot, of the boule to be cast. The casting matrix 7 is made by adding 5% to 20% by weight of low-dropping-point kiln grease to small, spherical, hollow fly ash ceramic beads that float on water. After compressing the casting matrix in a holding framework 8 a reduced barriers seed crystal 9 having dimensions in the range of 0.5-2 mm by 4-10 mm by 10-20 mm is inserted at the top of the holding framework 8 adjacent to the pilot 6. The thin face of the seed crystal is placed adjacent to the pilot in a corner. The pilot is then lightly shaken and twisted and then vertically extracted without disturbing the mold. The surface of the reduced barriers seed crystal 9 shows a single face and serves as the nucleation site for reduced barriers growth of the boule product. Melted semiconductor material 4 is then poured into the mold and allowed to slow-cool for 15 minutes. The cooling rate of the material is about one-hundred degrees (100°) per minute. This cooling rate results in reduced barriers growth from, top corner of the mold to the bottom. The seed crystal 9 remains attached to the boule product 2 as expected for growth of a reduced barriers from seed. The reduced barriers nature of the boule product 2 is indicated by the absence of grain boundaries on the surfaces of the boule product 2 after it is removed from the mold 5.

The reduced barriers nature of the boule product 2 is further supported by the electrical characteristics of the boule 2 that are determined by hot point probe measurements on the surface to determine Seebeck voltage and semiconductor-type. Seebeck voltage is characteristically between 52-72 millivolts at a 200-degree centigrade temperature differential. The reduced barriers nature of the semiconductor is further supported by the resistance of final shaped crystal boule product 2 and is determined by measuring the voltage across a 2-inch separation along the boule product 2 when 1 amp DC is passed along the axis of the boule 2. The resistance calculated from voltage measurement across a 2 inch separation on the boule product 2 is less than 0.0003 Ohms. The resistance of each 40-mil wafer is calculated with the above data to be less than 0.000006 Ohms per wafer.

Figure 2:
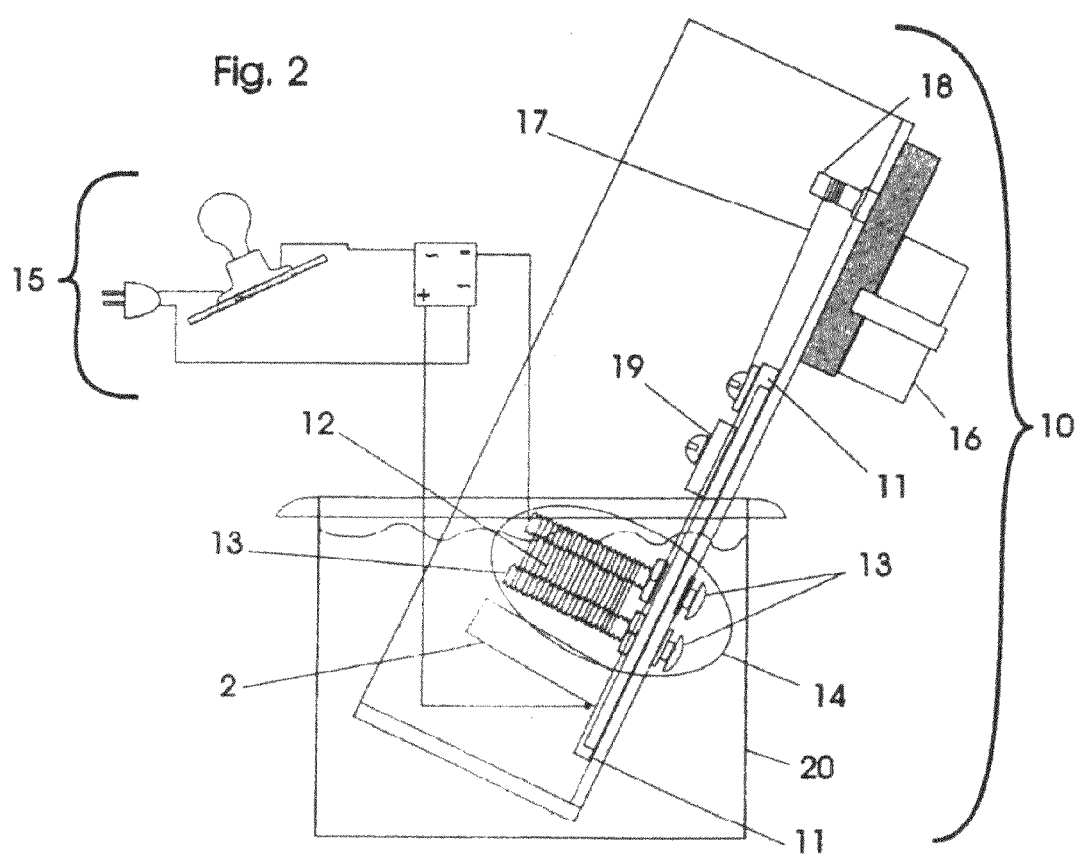
FIG. 2 illustrates a damage-free electrical wire-sawing fixture that cuts by anodic corrosion.

Production of uniform wafers is obtained using a wafer cutting assembly 10 shown in FIG. 2. The boule product 2 or a portion of it is mounted to a motor-driven slide 11 with a tilt of the upper portion toward cathode cutting wires 12. Cutting wires 12 form a single continuous line. Cutting wires 12 are separated by about 45 mils and held in alignment by threads of carriage bolts 13. The cutting wires 12 are made of brass of about 10 mils diameter. In a preferred embodiment 50-60 portions of wires make up a cutting head 14. The cutting wires 12 are connected to the cathode of a power supply 15 and the anode is connected to the bottom of the boule product. When the power supply is turned on it produces anodic corrosion as the boule moves slowly through the cutting wires 12 while 3-5 amps traverse through the boule product 2 to the cutting wires 12. The boule product 2 is moved by force from a motor 16 drawing a pull wire 17 from capstan 18 between guides 19. The boule product 2 and cutting wires 12 set are immersed in deionized water contained in vessel 20 during the anodic corrosion process. Cutting speed is about 1 hour for a boule product 2 having a ¾ inch cross-section. Evolution of gas bubbles aids in removing dissolved material from the boule product.

Figure 3:
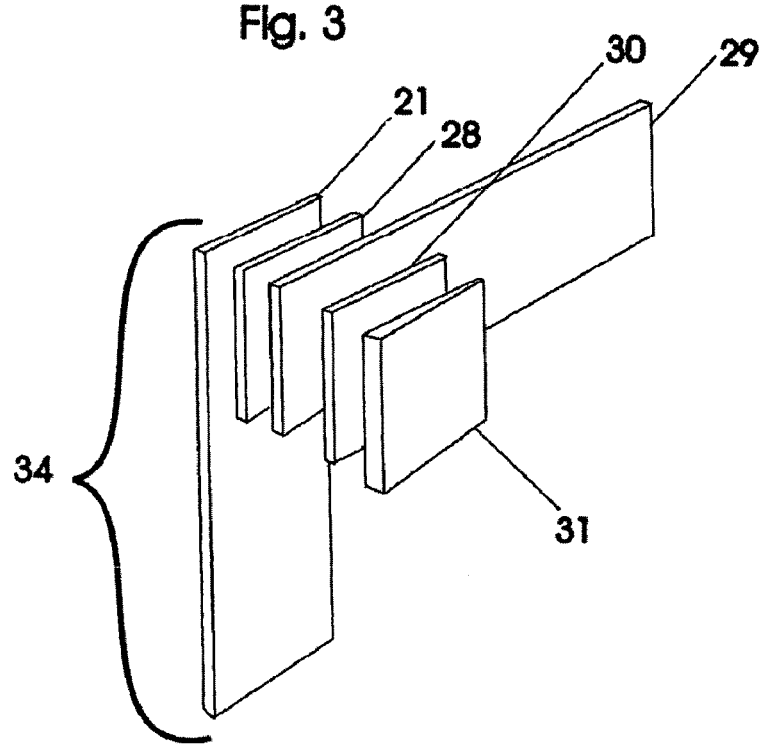
FIG. 3 is an exploded view illustrating various elements that are unified in assembling a standard coupon.

FIG. 3 illustrates a cold fin 21, a hot fin 29, an n-type crystalline semiconductor wafer 28 and a p-type crystalline semiconductor wafer 30 together with a wedge 31 that combine to form a standard coupon 34. FIG. 3 illustrates an exploded view of the elements of the standard coupon 34 and the relative position those elements occupy when they are assembled as a complete standard coupon 34. N-type crystalline semiconductor wafer 28 is juxtaposed with cold fin 21, which has a layer of solder paste in the region where the n-type semiconductor wafer 28 bonds to cold fin 21. Hot fin 29 has layers of solder paste in the regions that bond to n-type semiconductor wafer 28 and p-type semiconductor wafer 30. P-type semiconductor wafer 30 bonds with solder paste to one side of the wedge 31.

Figure 4:
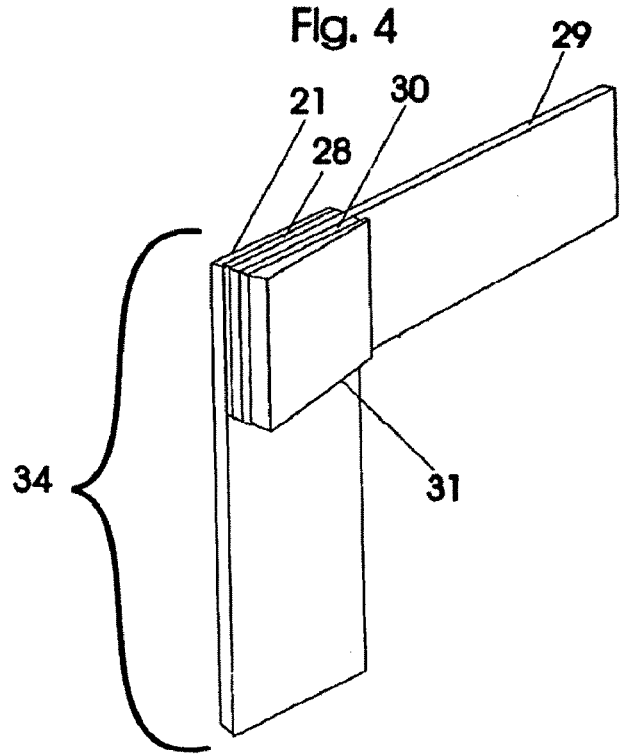
FIG. 4 illustrates an assembled standard coupon.
Figure 9:
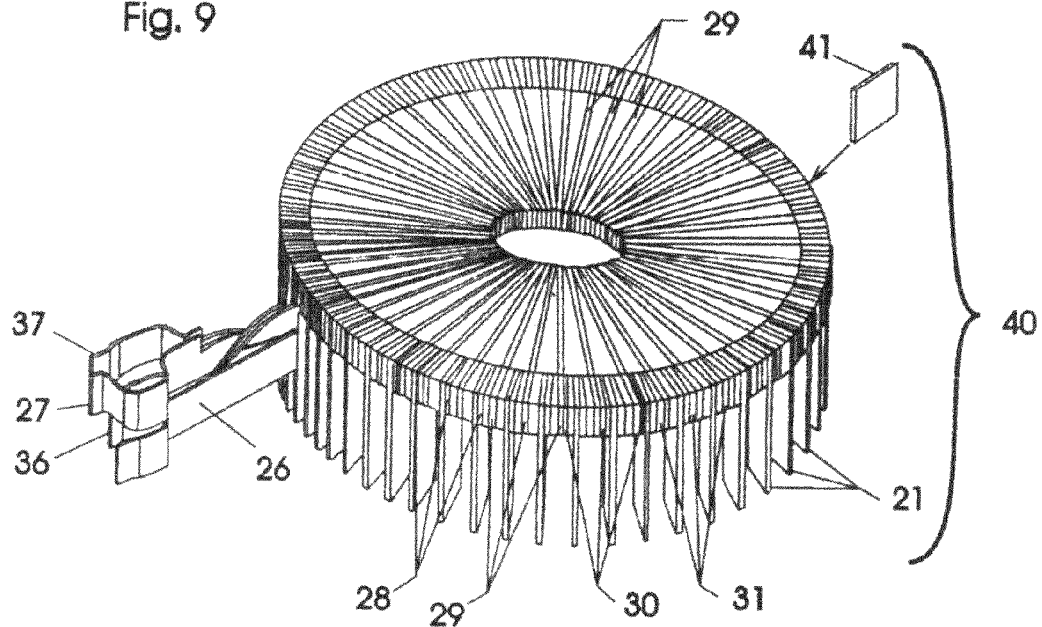
FIG. 9 illustrates an assembled ring with upconverter power takeoff.
Figure 10:
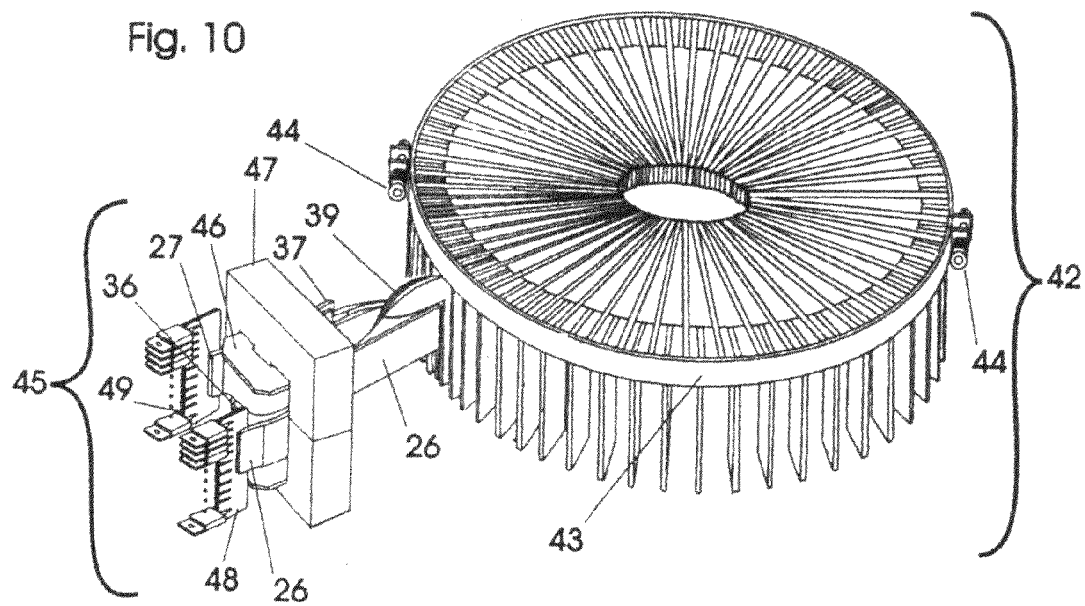
FIG. 10 illustrates a bonded ring with upconverter power takeoff, secondary coils and switch banks.
Figure 11:
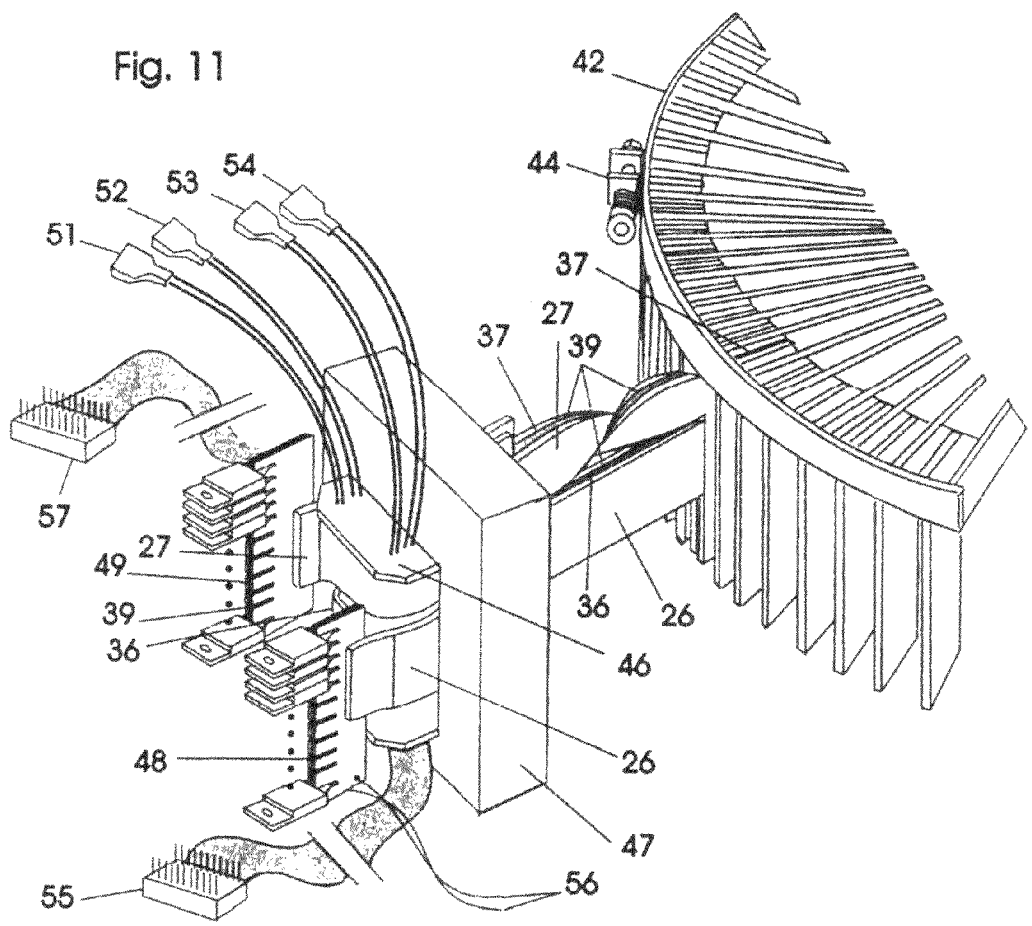
FIG. 11 illustrates the assembled ring with completed upconverter and connecting cables.

FIG. 4 illustrates the final positions of the elements of the standard coupon 34 seen in FIGS. 9, 10 and 11. A completed thermoelectric ring preferably includes sixty-two (62) standard coupons 34. The number of standard coupons 34 included in a thermoelectric ring can vary depending on the operating voltage desired. The Seebeck voltage also effects voltage production for a given temperature differential between hot fins 29 and cold fins 21. It should be understood that the cold fins 21 need not be oriented at ninety degrees (90° to the hot fins 29. Furthermore it is possible to shape either the hot fins 29 and/or the cold fins 21 to eliminate the wedge 31.

Figure 5:
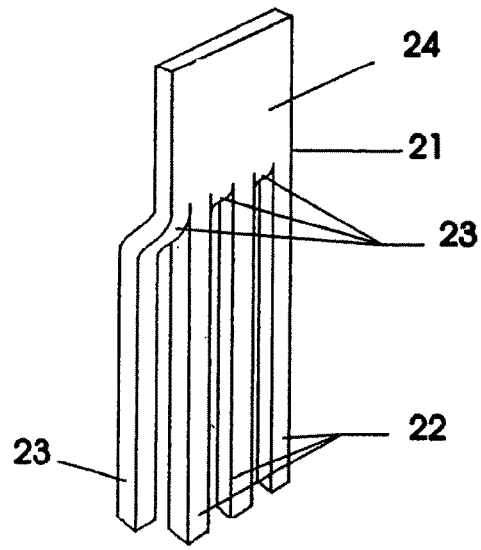
FIG. 5 illustrates a cold fin modified for improved cooling.

Energy conversion in the thermoelectric generator device is proportional to the temperature difference between adjacent hot fins and cold fins. As seen in FIG. 5, slitting the bottom and offsetting three of six sections produces a modified cold fin 21. Three pin fins 22 are not displace while three pin fins 23 are displace away from wafer contact surface 24. The wafer contact surface 24 is undisturbed allowing good contact with the wafers. A resulting benefit is to increase the surface area for cooling by a factor of 2. Improved efficiency of cooling is especially important because the highest reported melting point for dibismuthtritelluride is 585° C. This temperature is near the combustion temperature of propane and other common fuels.

Figure 6:
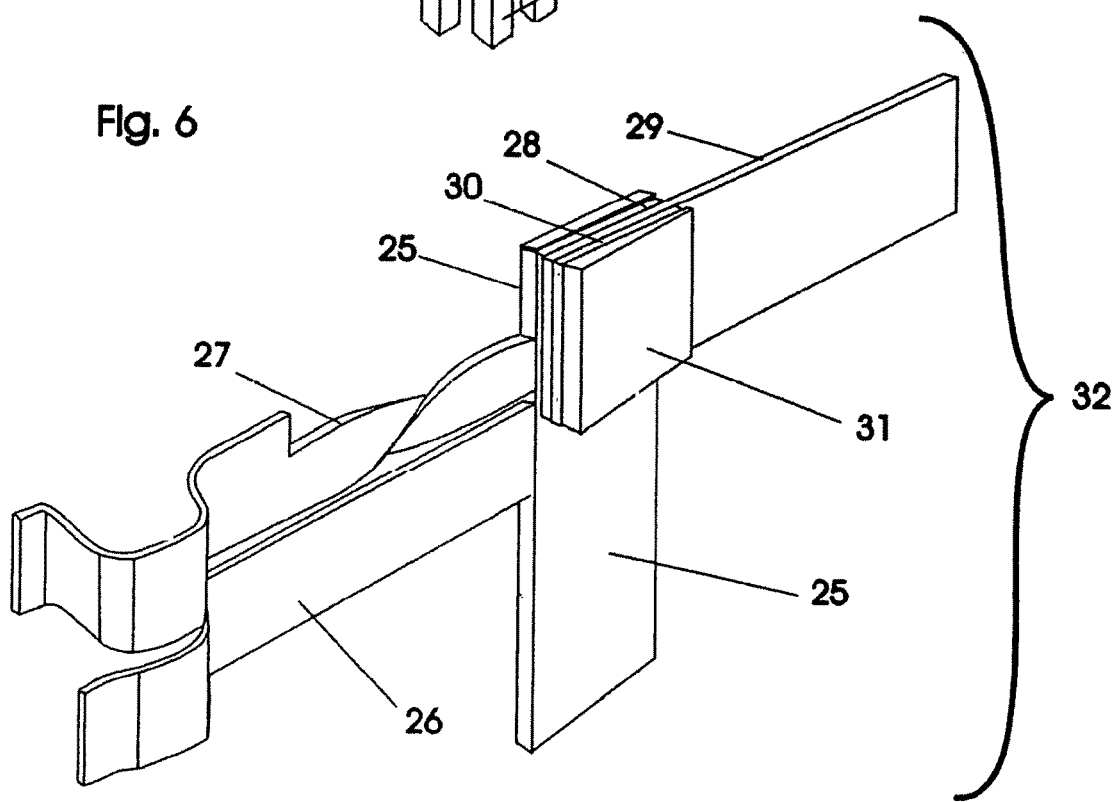
FIG. 6 illustrates a standard coupon with a special cold fin and attached upconverter power takeoffs.

FIG. 6 displays a modified coupon 32 with power takeoffs using a special cold fin 25 brazed to straight power takeoff 26 and twisted power takeoff 27. Special fin 25 is soldered to a coupon from which the original cold fin and its adjacent n-type semiconductor wafer 28 had been removed. The added cold fin with takeoffs and adjacent new n-type semiconductor wafer 28 is soldered to the hot fin 29. Hot fin 29 has next to it a p-type semiconductor wafer 30 and wedge 31. Power takeoffs 26 and 27 form a complementary set designed to physically mate to another modified coupon with takeoffs that match up to the regions of contact to MOSfet switch banks.

Figure 7:
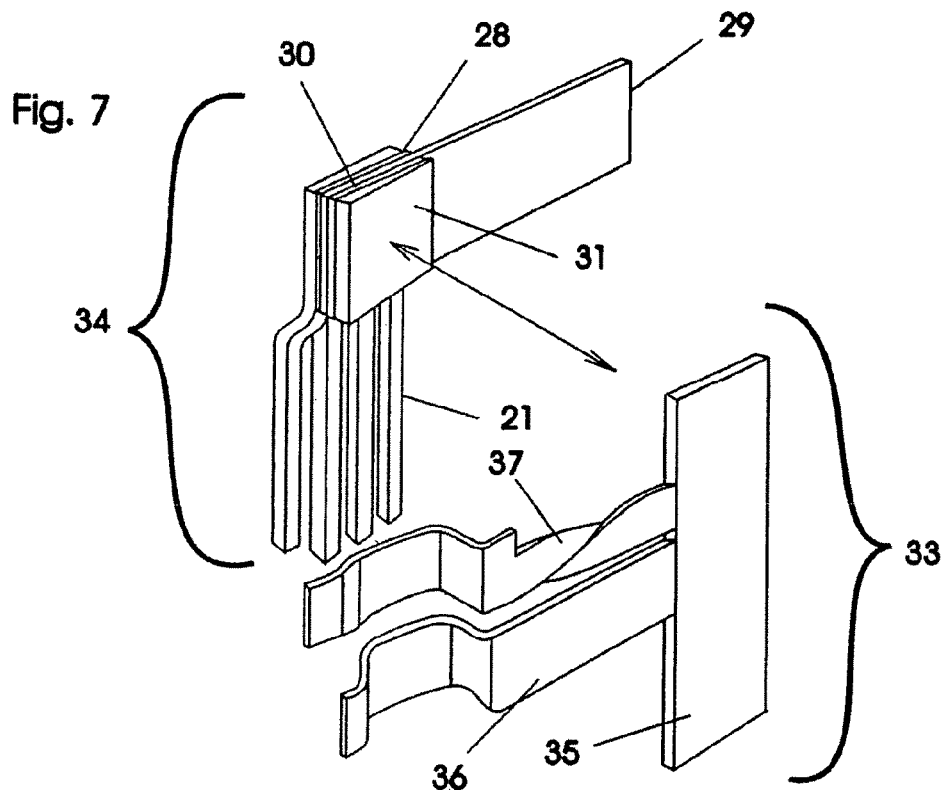
FIG. 7 illustrates how a standard coupon is connected to a modified cold fin with upconverter power takeoffs.

FIG. 7 shows an additional cold fin 35 with power takeoff laminates 36 and 37 arranged to be connected to a standard, coupon 34. Power takeoff 33 is made up of an additional cold fin 35 to which is brazed a straight power takeoff laminate 36 together with a twisted power takeoff laminate 37. The flat additional cold fin 35 allows a tight junction with wedge 31 of standard coupon 34. During assembly the additional cold fin 35 with attached brazed laminate straight takeoff 36 and twisted laminated takeoff 37 is added to the ring adjacent to a standard coupon 34.

Figure 8:
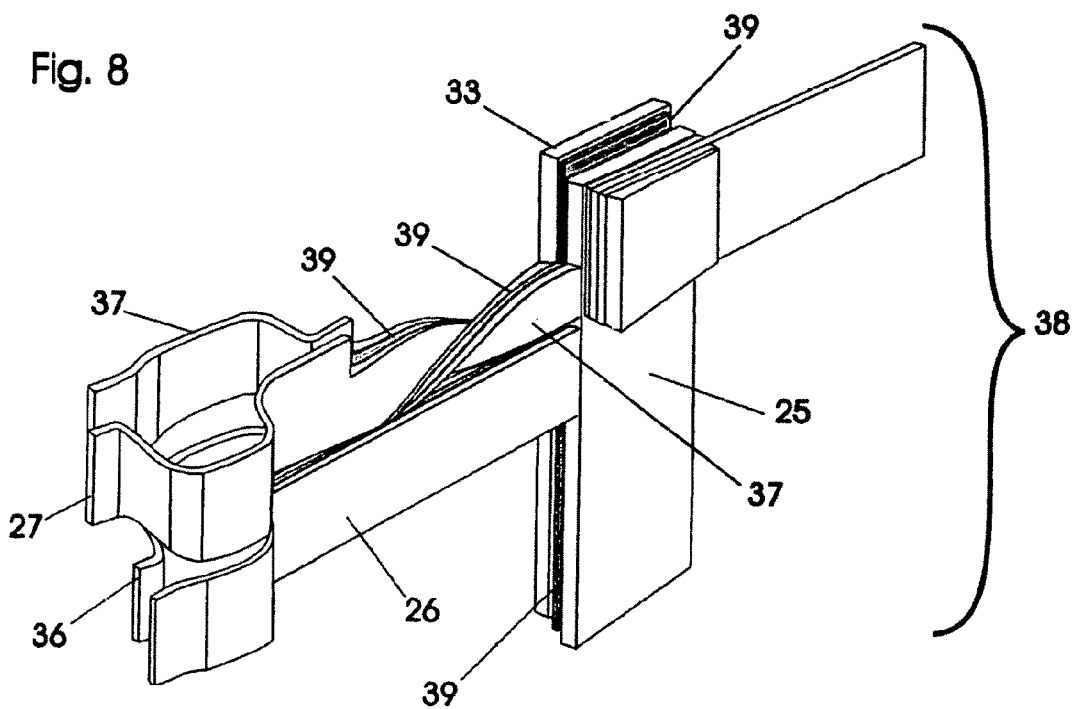
FIG. 8 illustrates how a modified additional cold fin with upconverter power takeoff connects with insulation and a standard coupon using a special cold fin having upconverter takeoffs.

FIG. 8 shows the combined power takeoff 38. It is assembled by nesting power takeoffs 27 and 37. In the assembled form it can be seen that the combined takeoffs produce two single turn current loops one above the other. When current is flowing in the ring and MOSfet switch banks are closed, current in the loop of the twisted takeoff 27-37 flows in an opposite direction to that of the straight power takeoff 26-36. An opening exists at the end of current loops 27-37 and 26-36 to which the MOSfet switch banks are solder connected. Assembly is made easier by offsetting the attachment site of MOSfet switch banks and aligning the attachment site of the MOSfet switch banks in a direction away from the thermoelectric ring of standard coupons 34. Insulation 39 is used to electrically isolate the additional cold fin 35 from modified coupon 32 shown in FIG. 6. Electrical insulation is also placed between laminate takeoffs 26-36 and 27-37 as well as between strips of the laminate. Each strip of the laminate is insulated except at the ends where they are all brazed in one instance to the cold fin and in another instance to the MOSfet switch bank. In a preferred embodiment strips of the laminate are brazed together at the non-insulated ends prior to being brazed to a cold fin and prior to being soldered to the MOSfet switch bank. This insulating material is preferably a thin layer of mica. Alternatively, the insulating material can be a thin layer of room-temperature vulcanizing rubber coated with small zirconium or other ceramic beads. Other kinds of beads of same particle size can also be used.

An example of a thermoelectric ring 40 prior to soldering is shown in FIG. 9. It is composed of n-type semiconductor wafers 28, hot fins 29, p-type semiconductor wafers 30 and wedges 31, and cold fins 21. The cold fins 21 depicted in FIG. 9 are the un-modified cold fins depicted in FIGS. 3 and 4. Also shown are the power takeoffs of the current loops to be connected to switch banks. Also shown in FIG. 9 are, straight laminates 26 and 36 and the twisted laminates 27 and 37. In a preferred embodiment to physically balance the thermoelectric ring assembly, a shortened cold fin 41 is inserted in to the thermoelectric ring 180 degrees across from the additional cold fin 35.

FIG. 10 illustrates the bonded thermoelectric ring 42 made up of thermoelectric ring 40 plus a polyimide insulated metal strap 43 held in compression by 2 diesel spring tensioned clamps 44. Also shown is a power takeoff upconverter 45 with secondary coils 46, E-core 47 and MOSfet switch banks 48 and 49. Controller printed circuit board 50, not shown in FIG. 10, controls MOSfet switch bank 48 solder-attached to straight laminate strap 26 and 36 and MOSfet switch bank 49 solder-attached to twisted laminate 27 and 37.

FIG. 11 illustrates how the single turn loops 26-36 and 27-37 are used to switch current direction around the E-core 47 with make-before-break switch banks 48 and 49, and to thereby convert DC high current in the bonded thermoelectric ring 42 into a high frequency AC output to leads at 51, 52, 53 and 54. The high frequency AC is converted back to DC voltage by bridge rectifiers on controller printed circuit board 50. The output voltage is 40 times higher than voltage produced by the bonded thermoelectric ring 42 at the switch banks 48 and 49 using upconverter transformer 45 comprising the single turn loops 26-36 and 27-37, a pair of bi-filar 40-turn secondary coils 46 magnetically coupled through an E-core 47 and bridge rectifiers on controller board 50. Secondary power for the printed circuit controller board is delivered by ribbon cable DIP plug 55. This cable delivers 18 volt AC for 4 or more independent power supplies each converted to DC using a bridge rectifier on the controller board 50 of FIG. 12. Power to the auto-start circuit not shown in FIG. 11 is delivered by a twisted pair of wires 56 connected across terminals of one of the MOSfet switch banks 48 or 49. Two ribbon cables shown in FIG. 11 lead from upconverter 45, to controller board 50 of FIG. 12. One cable connects switch banks 48-49 to the printed circuit controller board 50 with ribbon cable DIP plug 57. The other ribbon cable delivers power through DIP plug 55 to a controller board from four, 5 turn secondary, windings contained in secondary winding 46 around the center stem of E-core 47.

Figure 12:
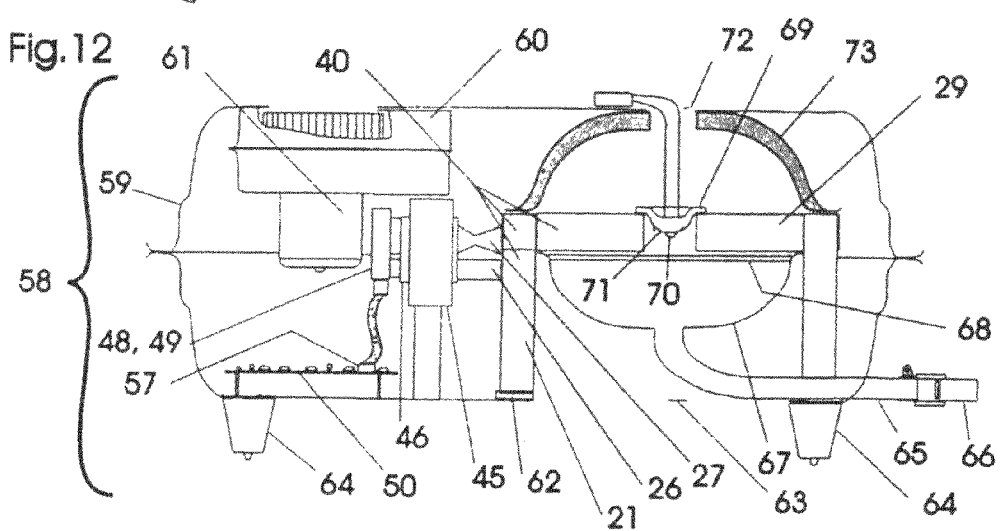
FIG. 12 illustrates a cross section of fuel-fired thermoelectric generator device with atmospheric exhaust.

FIG. 12 illustrates a gas burning thermoelectric generator device 58 with a case 59, blower 60 and motor 61. The ring 40, shown in cross-section as a vertical cold fin and horizontal hot fin, is mounted within the case supported by an insulator 62 below the cold fins 21. Power takeoff laminates 26-27 conduct current to the upconverter 45. The control operations are made using the components of the printed circuit controller board 50. Controller board 50 drives MOSfet switch banks 48 and 49. Cold air being push by blower 60 cools the controller board 50, and in addition cold fins 21 and exits the distinct orifice 63. The blower 60 is sized and the controller board 50 is arranged with respect to blower 60 so as to allow and least 10% of the air pressure produced by the blower to impinge on controller board 50. The blower and its motor are so arranged in said box as to allow said output of the blower to cool cold fins wherein the amount of air pressure from the blower is at least 30% of the pressure produced by the blower. Legs 64 below the case 59 hold the case off the ground. Fuel duct 65, a distinct orifice, and fuel venturi nozzle 66 provide fuel to the lower combustion bowl 67. Fuel is combusted just below the hot fins due to stimulated catalytic effect of a burner screen 68. Preferably the screen is made of perforated ceramic but a metal screen can be used as well. Efficient ignition of fuel is provided by non-combustible plug 69 using a resistance-heated igniter 70 or spark igniter 71. Ignition plug 69 is positioned at the center of the ring 40 so as to force combustion gas over the hot fins 29. Combusted gas exits through an exhaust port distinctive orifice 72 in the insulated upper burner bowl 73. Insulation is shaded. This version of the semiconductor device can also be use to burn liquid fuels by replacing the venturi gas inlet nozzle 66 with an atomizing fixture such as a fuel injector. In a preferred embodiment the insulated upper burner bowl is a double bowl with insulation in between each bowl.

In a preferred embodiment non-combustible plug 69 is made of ceramic material and shaped so as to allow the center portion of the resistance-heated igniter 70 to occupy the open center of the ring and side portion to rest upon the end of the hot fins 29 thereby forcing hot air and combusted gases through the hot fins. Resistance heater 70 can be replaced by a spark igniter 71.

In another preferred embodiment a temperature sensor is added to the plug 69. The temperature sensor controls a fuel valve to cut off fuel in the event that the temperature exceeds a pre-set value. This value is set below the melting point of the n-type or p-type semiconductor material.

In another preferred embodiment cold fins are placed in a non-metallic U-shaped ring-shaped tray. The tray is filled with water preferably by an automated filling system with controls to prevent overflow. The height of the walls of the U-shaped tray and the width of the tray are adjusted with regard to the air flow of blower 60 so as to optimize overall cooling efficiency. Electrical energy production is improved by the evaporative cooling effect on the cold fins as air from blower 60 passes over water in the U-shaped tray to exit distinctive orifice 63.

In another preferred embodiment the U-shaped tray is fitted on the inside wall with a plurality of spray nozzles facing the cold fins. Water is pumped from the tray through the nozzles and the height of the outside wall of the ring is set with respect to the location of the nozzles so as to have the outside wall catch excess directed spray. In a preferred embodiment the height of water in the tray is controlled electronically or by a float mechanism.

Figure 13:
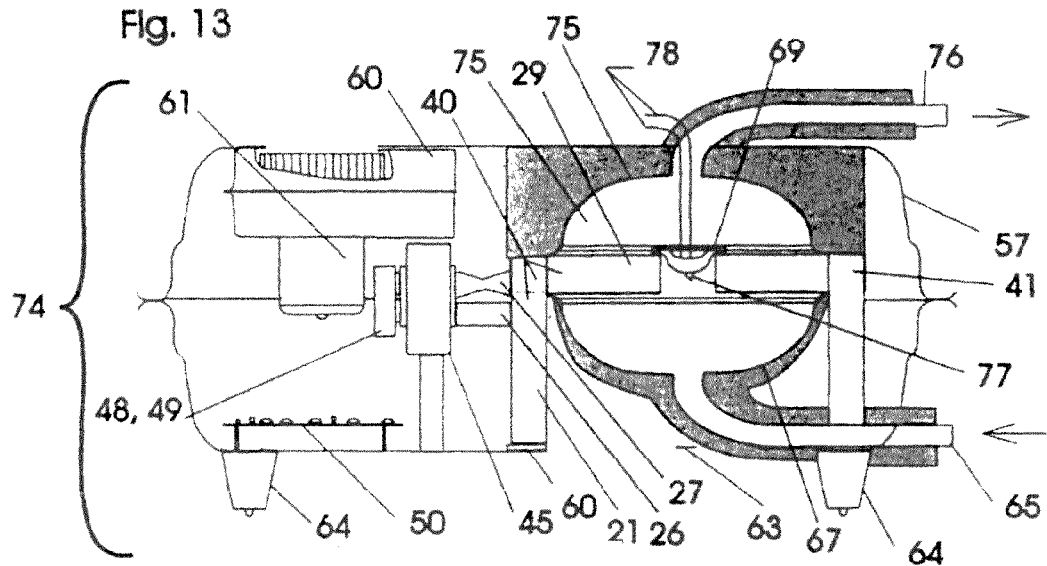
FIG. 13 illustrates a cross section of a thermoelectric generator device configured for the utilization of hot circulating air.

A versatile configuration of the thermoelectric generator device 74 is shown in FIG. 13 This version allows the use of externally supplied hot air. This hot air can be derived from externally combusted sources, direct solar derived heat or solar energy stored in hot solids, preferably porcelain fragments. Hot air from porcelain fragments in heat storage, not shown, enters the lower combustion bowl 67 through distinct orifice insulated pipe 65. Hot air passes hot fins 29 and exits through insulated upper bowl 75 then through insulated exhaust pipe distinct orifice 76. Plug 69 is configured as a temperature sensor with temperature sensor 77 with sensor output lines 78. The plug forces air around hot fins 29. Distinct orifice 63 allows cooling air driven by blower 60 to exit. Features blower 60, motor 61, power takeoff laminates 26 and 27, upconverter 45, MOSfet switch banks 48 and 49 and controller board 50, are the same as in the fuel burning versions of the thermoelectric generator device 58 of FIG. 12. This version is also suitable for utilizing heat from steam sources. This can be accomplished by providing a heat exchanger between the source of steam and the re-circulating air line through insulated pipe 65 of this version of the thermoelectric generator device. As with the fuel burning version of the thermoelectric generator device 58 of FIG. 12 this version can also be fitted with a water filled U-shaped ring under the cold fins to obtain the benefit of evaporative cooling as air from blower 60 passes over the cold fins and water in the tray before exiting distinct orifice 63.

Figure 14:
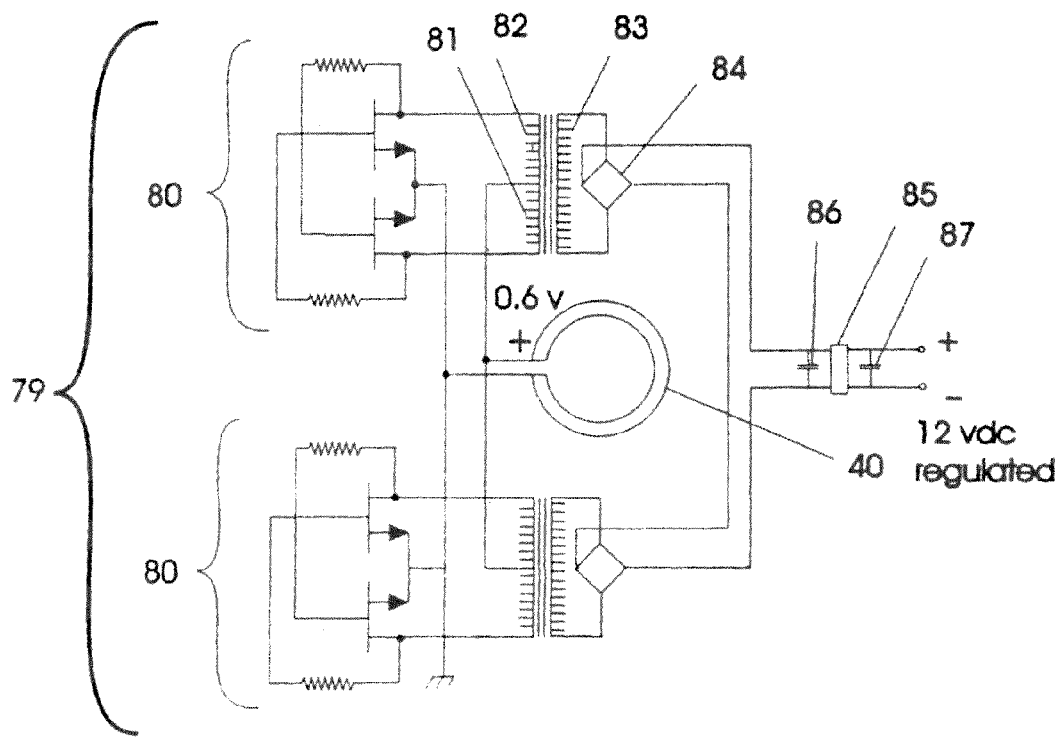
FIG. 14 illustrates a self-starting circuit that allows electrical elements to derive power for operation as the thermoelectric ring is initially heated.

FIG. 14 shows a preferred alternative method to electrically start the thermoelectric generator device, a special transformer component 79. When the thermoelectric generator ring 40 is first heated a small voltage appears across the ring but no current flows because the MOSfet switch banks are normally open. Low impedance NPN oscillator circuits 80 can start at 0.6 volts by drawing current from the ring. This oscillator 80 causes current to flow alternately in primary windings 81 and 82. The resulting power output of secondary coil 83 powers the bridge 84 to deliver DC voltage to low dropout DC regulator 85. Capacitors. 86 and 87 condition the output and low drop out voltage DC regulator 85 produces regulated power output of 12 VDC at 100 milliamps from a set of oscillators 80 connected in series. This component 79 eliminates the need at startup for a special battery to provide power to the controller board.

Figure 15A:
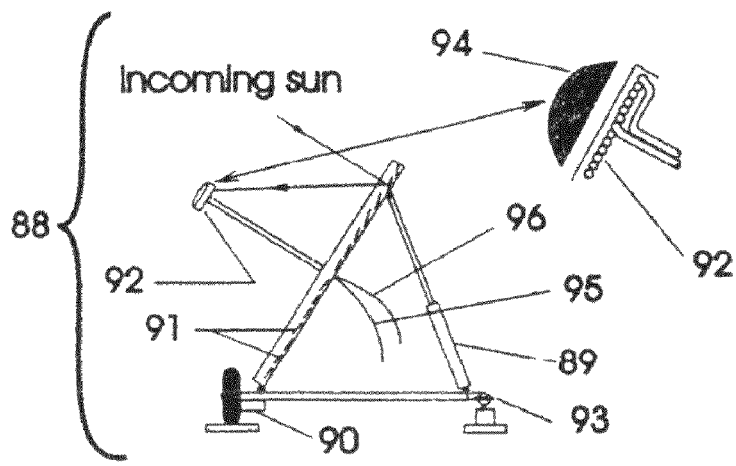
FIGS. 15a, b and c illustrate a preferred system for solar energy collection

This invention is especially suited to the conversion of solar energy to electricity. Any of several means to collect solar energy can be used such as parabolic trough, a solar tracking funnel, a solar tacking parabolic dish, or a folded lens. A preferred method is flat 2-axis tracking multi-faceted Fresnel planar mirror, array 88 as in FIGS. 15*a*, 15*b* and 15*c*. The 2-axis self-tracking feature includes an up/down actuator 89 and motor driven rubber tires 90. The illustrated version has about 300 mirrors 91. Mirror size is the same as the target 92. Mirrors 91 are individually mounted on an adjustable ball joint not shown to allow adjustment of each mirror so incoming sun reflects on target. A trailer ball-hitch 93 shown in FIGS. 15*a* and 15*c* allows for rotation of the mirror array to track the sun during daylight hours. When the mirror array is moved to the horizontal position a laser plum-bob is used to shine downward on each mirror 91 so that each can be aligned to cast the laser beam on to the target 92. Each mirror is then secured. After all mirrors are aligned the array is then returned to the solar tracking position. This form of solar collection allows easy cleaning, alignment and replacement of mirrors. In severe weather, such as during a hailstorm or high winds, the array is protected by lowering it to a horizontal position and the mirrors then covered with plywood storm panels or other sturdy material.

The target 92 is a stainless steel, spiraled tube with insulator 94 on the sun side. Hot air passes from a heat store, not shown, through duct 95 forced by blower, not shown, through insulated receiver target 92 exiting through insulated line 96 returning then back to the heat storage. The number of mirrors and the size of the target are adjusted to keep the temperature of the target below its melting temperature. All transfer tubing and the blower are heavily insulated to prevent conductive and irradiative heat loss. The blower is a high temperature resistant type. In a preferred embodiment the heat store is made up of porcelain fragments or spheres. The porcelain fragments are contained in 55 gallon stainless steel barrels insulated with one or more low heat conductive materials such as a ceramic fiber blanket made of alumina-silia fiber bonded with a resin. This material stands up to temperatures of 1150 degrees C. Similar insulating material can also be used. The stainless steel barrels can be replaced by any of a variety of high temperature air tight metal heat store or any of a variety of ceramic heat stores.

Figure 15B:
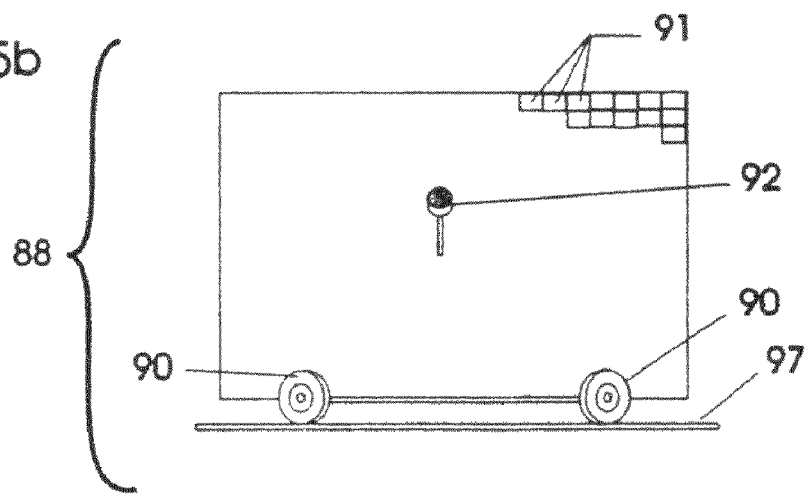
Figure 15C:
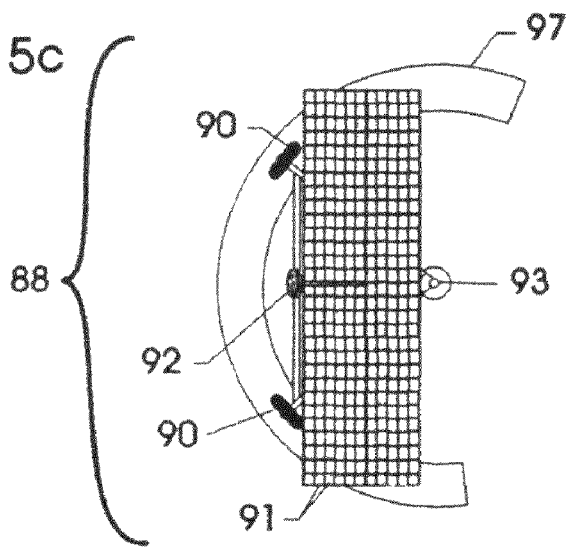

FIG. 15b shows a frontal view of the mirror array 91 operating on wheels 90 on a hard surface track 97. FIG. 15c shows a top view of the mirror array 91 supported by trailer ball-hitch 93 and target 92.

Figure 16:
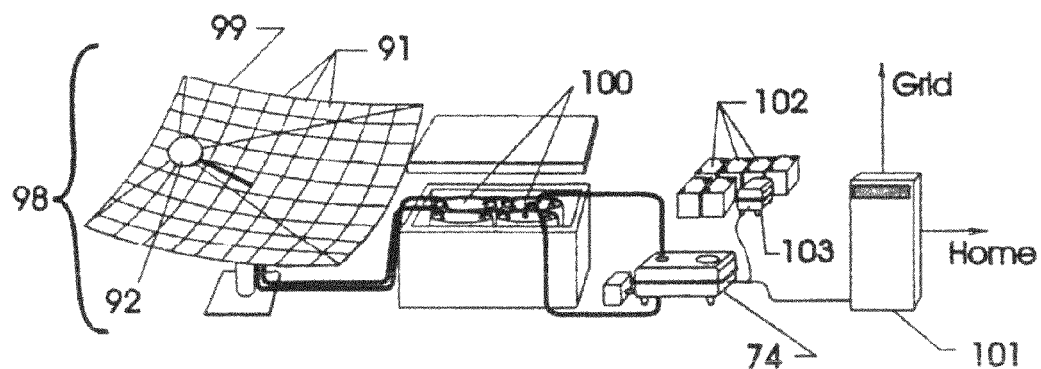
FIG. 16 illustrates heat energy store and a preferred system for solar energy collection, storage and re-utilization.

Another preferred embodiment for solar energy collection and storage is shown in FIG. 16. An integrated energy system 98 combines a parabolic solar collector 99 on a gun mount, heavily insulated heat energy store 100, a hot air thermoelectric generator device 74, electrical energy output unit 101 and a set of batteries 102. Six 12-volt car batteries can supply 3.6-kW for three to five minutes while the thermoelectric generator device is increasing its output to assume the load. This feature allows the thermoelectric generator device 74 to operate at minimum electrical output and thereby conserve heat. It also reduces the occurrence of light dimming when high power demand appliances come on-line. As needed the thermoelectric generator device charges the batteries 102. The batteries in series are connected through an inverter 103 to the AC thermoelectric generator bus connecting thermoelectric generator device 74 to electric energy output unit 101 to match and support the AC voltage at a predetermined level and assume part of the load as needed.

Figure 17:
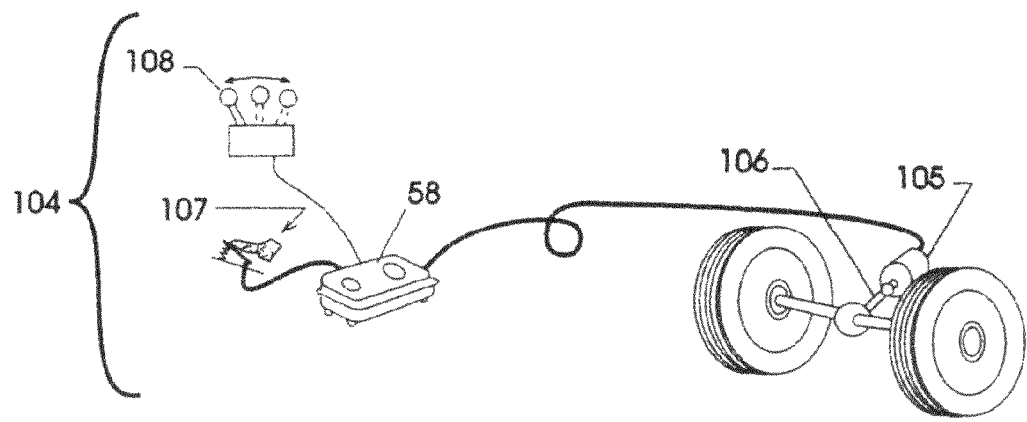
FIG. 17 illustrates the use of a high efficiency thermoelectric generator device to power an electric motor that connects to the drive shaft of an automobile.

Thermoelectric generator devices can be used in a wide variety of applications. For example a set of components 104 in FIG. 17 can be used in an automobile that has a failed engine. An automobile can be powered using a fuel burning three phase thermoelectric generator device 58 by removing the old engine and transmission and adding a single electric motor 105 connected directly to a special drive shaft 106. FIG. 17 illustrates the use of a high efficiency thermoelectric generator device to power an electric motor 105 that connects to the special drive shaft 106 of an automobile. The speed of the motor resides with a standard foot pedal 107 that now controls the frequency of the electrical output of thermoelectric generator device 58. Motor and therefor wheel direction is controlled by a standard car shifter 108 modified to cause phase shift for forward, neutral and reverse automobile's direction.

Figure 18:
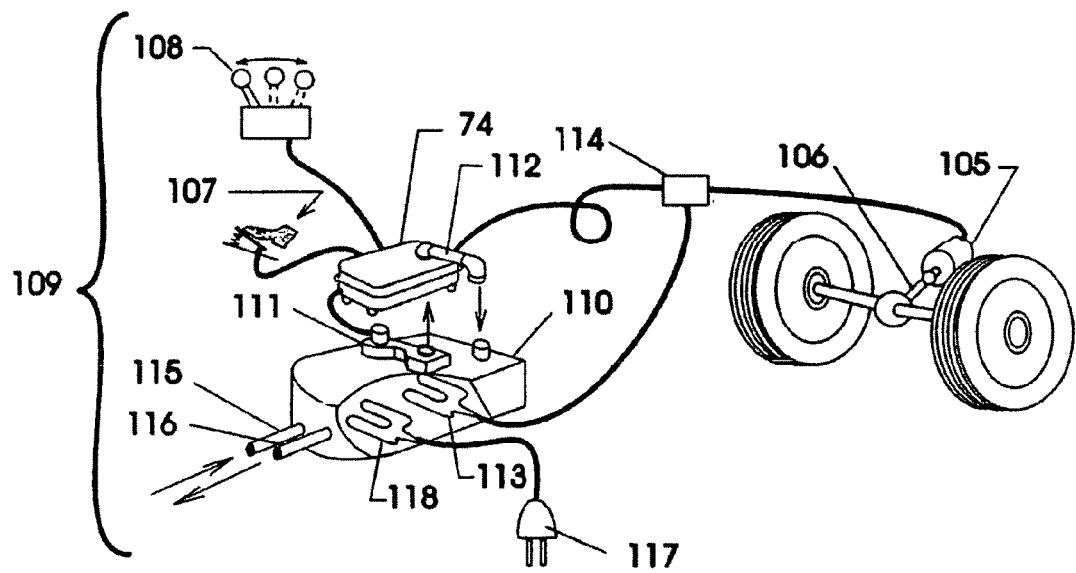
FIG. 18 illustrates the use of heat stored in ceramic fragments to drive a conveyance using a thermoelectric generator wherein wheel braking energy is conserved using resistance heating in the heat store.

Stored heat alone can be use to power a conveyance 109 as shown in FIG. 18. Heat stored in a porcelain fragment heat store 110 can be transferred to thermoelectric generator device 74 using a blower 111 then exhaust heat returned to heat store in well insulated air line 112.

FIG. 18 illustrates one configuration. A significant feature of this system is the energy saving in wheel braking. This is done by shunting the energy in the armature of the electric motor 105 to resistive heater 113 in the porcelain fragment heat store. A control box 114 senses over-voltage on the motor power bus indicating braking with the automobile's hydraulic brake system and causes the shunting of the excess energy to the resistive heater element 113. The car then brakes in a forceful and safe manner controlled by control box 114 and the automobile's normal brake system. Porcelain fragment heat store 110 can be heated by circulating heat from a stationary heat store 100 through insulated input line 115 and returning to stationary heat store 100 of FIG. 16 through insulated output line 116. In addition heat can be installed in porcelain fragment heat store through resistance heating from the utility grid through electrical plug 117 and heating element 118.

Figure 19:
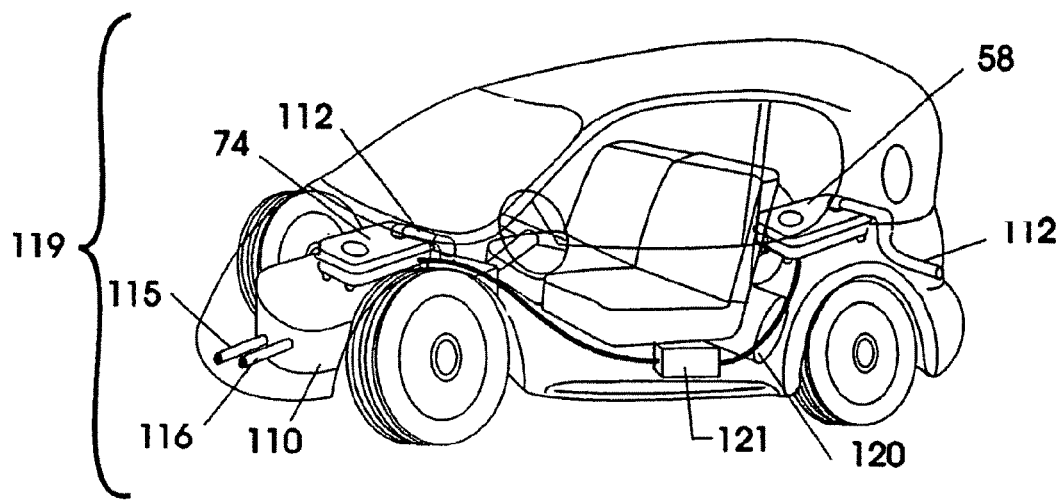
FIG. 19 illustrates a hybrid vehicle having both a heat reservoir source and dedicated thermoelectric generator device and in addition a second thermoelectric generator device that burns liquid fuel.

Another preferred conveyance form 119 shown in FIG. 19 comprises hybrid energy sources. For example, a vehicle has both a porcelain fragment heat store 110 source powering a dedicated thermoelectric generator device 74 and in addition a second thermoelectric generator device 58 that burns liquid fuel from the original fuel tank 120. Hybrid energy source preferred conveyance form 119 has the same resistance-braking feature as conveyance 109. Preferred method uses solar heat energy first and supplemental fuel later. In some cases more energy is needed than the porcelain fragment heat store 110 can supply and controller unit 121 is engaged to synchronize the output of both thermoelectric generator devices 74 and 58. Synchronization is accomplished by the methodology used for battery backup described in FIG. 16. When conveyance 119 is operating at maximum power from 74, witnessed by full extension of the accelerator pedal 107, controller unit 121 is activated to ignition start thermoelectric generator device 58 that operates on fuel from the conveyance fuel tank 120. Thermoelectric generator device 58 comes on line to assume the extra load increasing output power to the conveyance. For AC drive applications, phase synchronization between thermoelectric generator devices 74 and 58 is achieved through controller unit 121 phasing thermoelectric generator device 58 to conform to the exact phase of thermoelectric generator device 74. When load demands of the conveyance 119 become low, controller unit 121 commands thermoelectric generator device 58 to stand at the ready or thermoelectric generator device 58 can be shut down until later needed. For high-energy demands multiple thermoelectric generator devices such as those depicted in FIGS. 12 and 13 can be organized in an appliance 122 of FIG. 20 comprised of a single rack 123 and other features.

Figure 26:
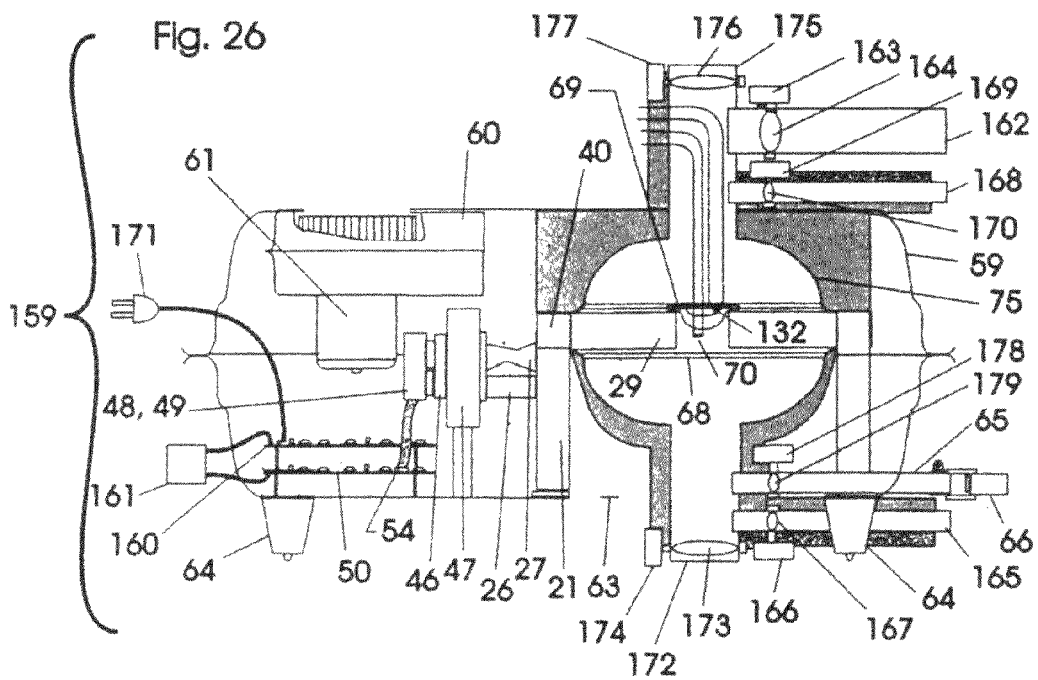
FIG. 26 illustrates a thermoelectric generator device modified to operate with liquid or gaseous fuels and hot air from solar heating that can also be operated as a solid state chiller.

A similar dual fuel operation of a vehicle can be accomplished using the device shown in FIG. 26, organized without the grid-driven cooling feature.

A variety of other conveyances can be powered by a single thermoelectric generator device or a device arrangement in the nature of that described above. These include but are not limited to land conveyance such as a bicycle, a truck, a bus, a tractor, a motor cycle, a snow mobile, flying conveyances such as an air plane, a helicopter, a gyrocopter, a parasail, and water conveyances such as a fishing boat ski boat, tug boat, ocean liner, a jet ski, and submarine.

Figure 20:
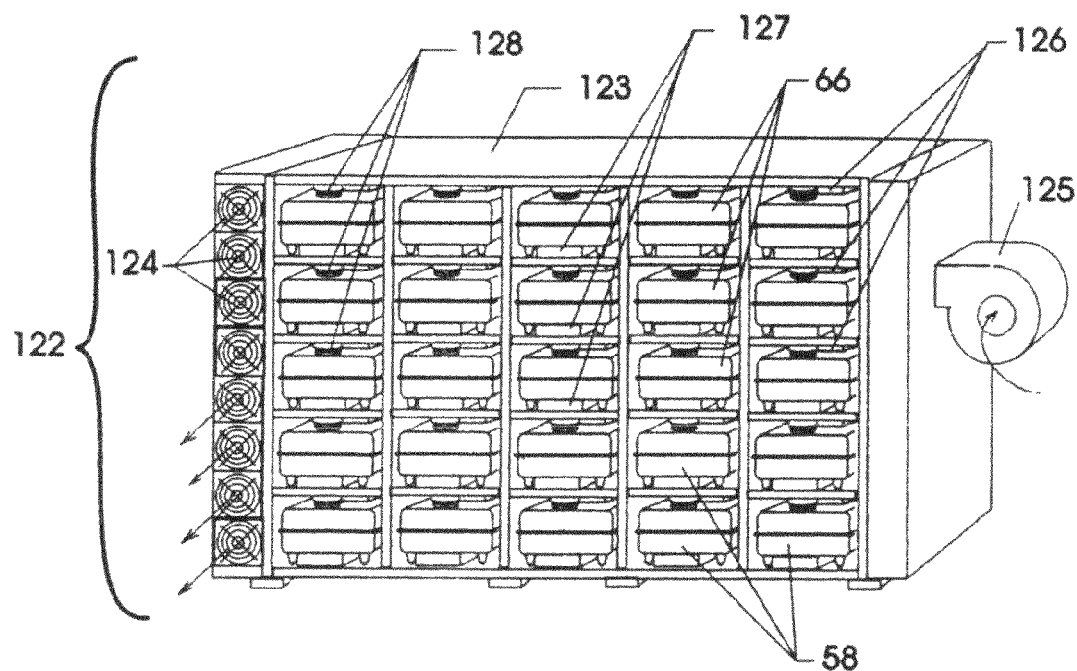
FIG. 20 illustrates an assembly of multiple thermoelectric generator devices such as those depicted in FIGS. 12 and 13 organized for synchronous controlled output.

FIG. 20 illustrates an appliance 122 included in an assembly of multiple thermoelectric generator devices 58 organized as an array of rows and columns that is suitable for synchronous controlled output. In addition multiple thermoelectric generator devices 58 can advantageously employ organized combustion venting fans 124, combined cooling air blower 125 that forces air through manifold 126. This provides air for cooling the controller board 50, upconverter 45 and cold fins 21. Exhaust air from the cooling fins that normally exits distinct orifice 63, not shown in FIG. 20, enters exhaust manifold duct 127 by displacing a moveable cover making a closed tight air sealing contact between exhaust manifold duct 127 and exhaust port 72 as shown in FIG. 12 of thermoelectric generator 58. Air is removed from exit exhaust manifold duct 127 using venting fans 124. Air to cool cold fins is removed from distinct orifice outlet 63 along with combustion gas from exhaust port 72 through draft diverter exhaust manifold duct 128 to exhaust manifold duct 127 diverter by exhaust venting fans 124. When a thermoelectric generator device 58 is placed in the rack it forces a closure back to allow continuity between the distribution system manifolds and the device 58. Thus multiple exterior fans can provide cooling air for all thermoelectric generator devices 58 in the single rack 123. In a similar manner combusted air normally exiting distinct orifice 72 exits through a draft diverter exhaust manifold 128 connected to high velocity venting fans 124 pulling air to the outside. Air for combustion is also provided through the open front of single rack 123. A number of thermoelectric generator devices can be removed from the single rack for maintenance without interrupting service from the remaining. FIG. 20 shows a 5 by 5 thermoelectric generator single rack that produces 250-kW when each thermoelectric generator device 58 produces 10-kW. Four of the rack systems would produce a Megawatt of energy that will power 1000 average homes or an industrial park. While this FIG. 20 illustrates the use of multiple combustion thermoelectric generator devices 58, a similar system using hot air driven thermoelectric generator devices 74 can also provide similar power output. In this case hot air is supplied by a manifold to each thermoelectric generator device 74 and in addition hot air that normally exhausts to the ambient now enters a tight insulated manifold that eventually returns to a heat store, a scaled up version of stationary heat store 100 in FIG. 16.

Figure 21:
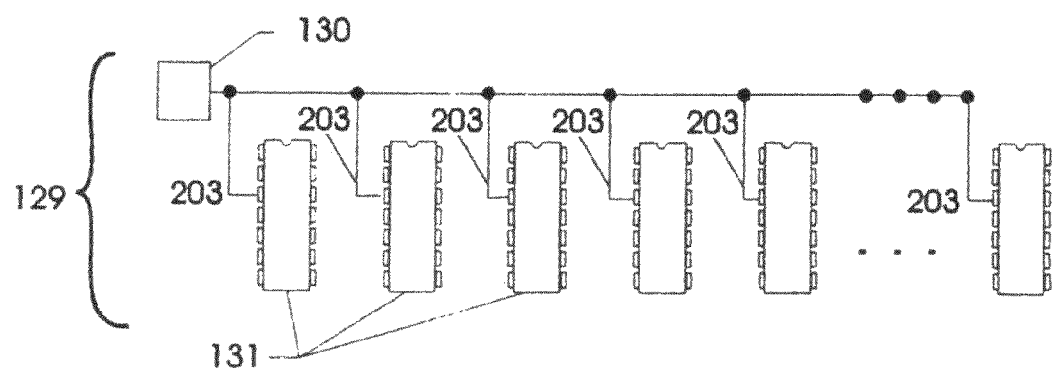
FIG. 21 illustrates a method to synchronize multiple thermoelectric generator devices.

In rack form especially, thermoelectric generator devices can be synchronized as to phase and voltage output. FIG. 21 illustrates a circuit 129 that shows how a single waveform generator 130 is used to synchronize all subsequent waveforms by inserting a wave form from 130 on a pin 203 of pulse-width modulator chips 131, located on the controller board 50. This feature causes all thermoelectric generator device outputs to become synchronous as to phase, waveform and voltage. The power outputs of each thermoelectric generator device can then be summed on a common power bus.

Figure 22:
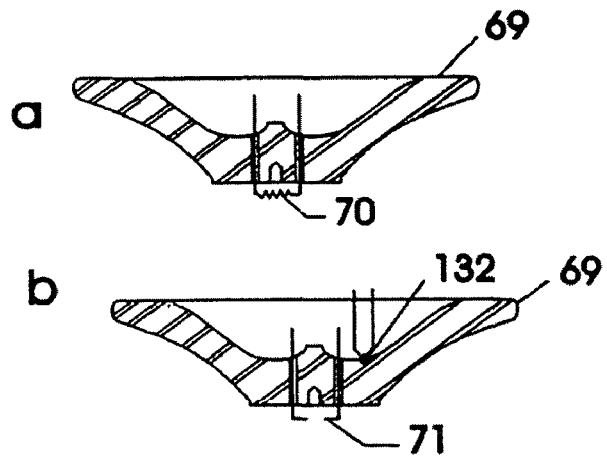
FIG. 22a illustrates a non-combustible plug containing igniter means and 22b illustrates a non-combustible plug containing a temperature sensor.

In FIG. 22 another preferred embodiment FIG. 22a shows a plug 69 with a resistance-heated igniter 70. Plug 69 is placed in the center of the ring 40. An alternative version of plug 69 has spark igniter 71 shown in FIG. 22b that can also be used to ignite gas or aspirated liquid fuel entering the lower combustion bowl. The plug 69 forces hot gas through the hot fins. When the thermoelectric generator device utilizes hot air, plug 69 is equipped with a heat sensor 132 in FIG. 22b to input a thermostat allowing the system to be under precise control with respect to heat energy into the thermoelectric generator device and electrical power out of the thermoelectric generator device. The thermoelectric generator devices 58 in FIG. 20 each have an electric ignition starter. In some cases multiple thermoelectric generator devices will be driven by hot air. In these cases plug 69 has a heat sensor 132 inserted as shown in FIG. 22b. Each of the displayed non-combustible plugs were shown earlier in less, detail.

Figure 23:
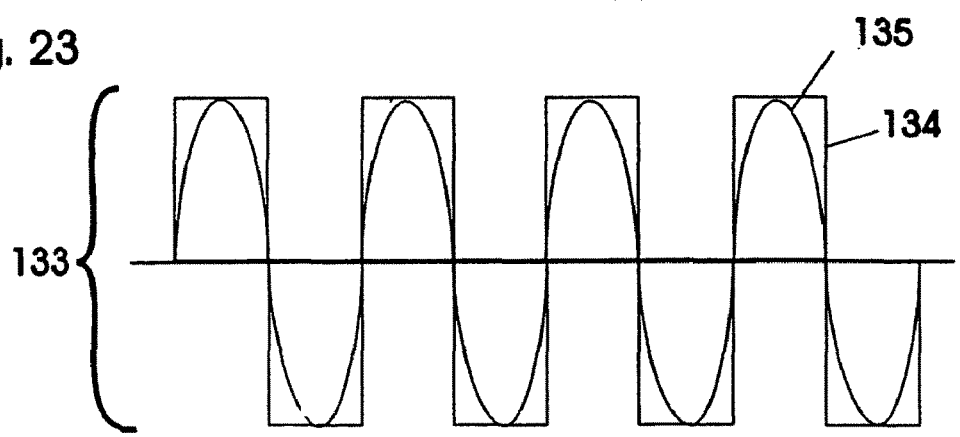
FIG. 23 illustrates the improved energy output of square waves derived from the H-bridge compared to a sine wave output of other systems.

A preferred output means 133 is shown in FIG. 23. A series of waveforms illustrate the improved energy output of square waves 134 derived from the H-bridge compared to a sine wave 135 output of other systems. The square wave can output nearly all of the energy from thermoelectric generator devices 58 and 74 contrasted with the value of 70% for sine wave outputs. The square wave output does not adversely affect AC appliances.

Figure 24:
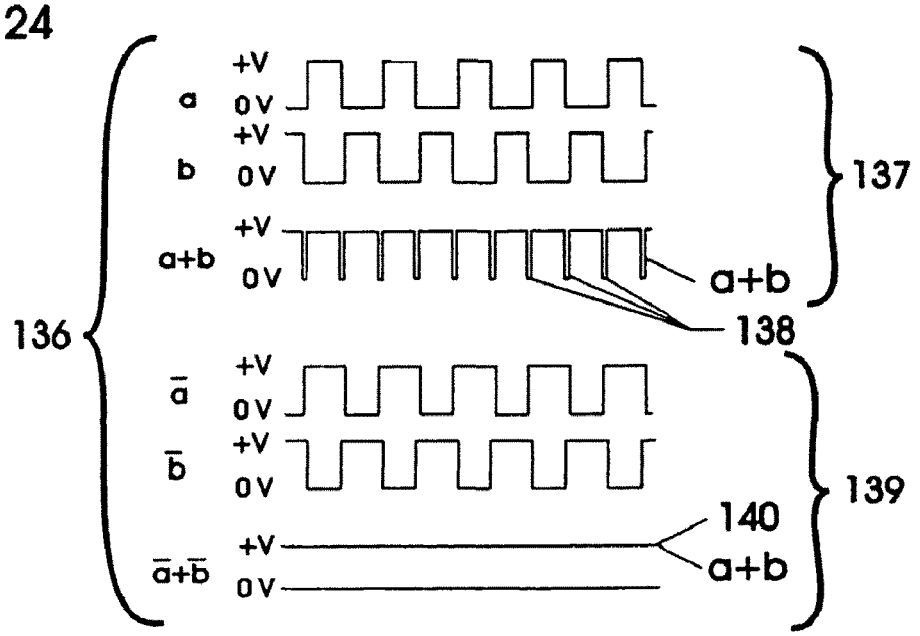
FIG. 24 illustrates the nature of the output waveforms controlling the ring current showing a make-before-break format accomplished by inverting the electric output waveform wherein voltage spikes are removed.

Shown in FIG. 24 is a set of output waveforms 136 from pulse width modulators 131 used in this invention to control the MOSfet switch banks. Output non-inverted waveforms 137 show the a and b outputs of normal waveforms of the pulse width modulator driving the upconverter 45. The a and b waveforms are electrically combined and the result is a zero voltage in short intervals shown in 138. Because no voltage exists no current flows in ring 40. The break in current in the ring and in the E-core 47 due to short intervals of no current causes a very large electromagnetic pulse output that can damage components of the thermoelectric generator device and can broadcast electromagnetic pulses to damage other appliances. Waveforms shown in 139 are inverted waveforms caused by using inverted MOSfet drivers to control MOSfet switch banks 48, 49. When the inverted waveforms are added in 140 there is no time when a zero voltage or zero current condition exists in the ring. 40 or E-core 47 as illustrated by summing waveforms in 139. This comprises a make-before-break switching format accomplished in this invention.

Figure 25:
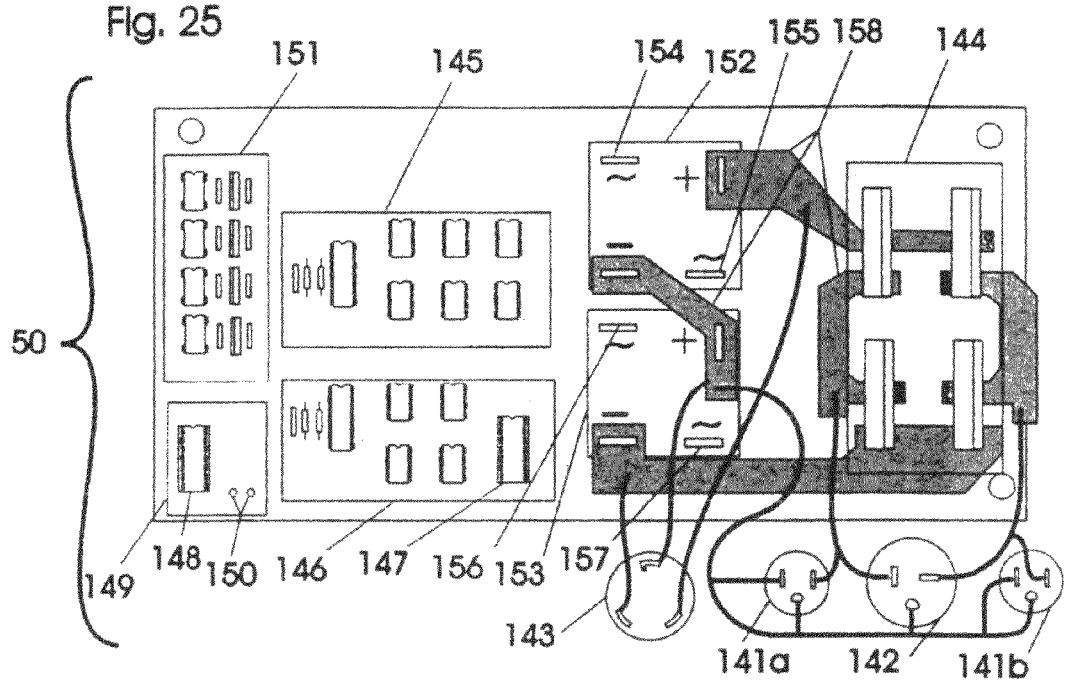
FIG. 25 illustrates a printed circuit controller board with designated functions.

Several control features are combined on a single printed circuit controller board 50 having output grid equivalent receptacles 141a, 141b, 142 and DC receptacle 143. FIG. 25 shows a controller board 50 divided into functions; H-bridge 144, a 50-60 Hertz driver 145 for H-bridge 144, a high frequency inverted driver 146 for the MOSfet switch banks 48-49 controlling current flow in the single turn loops 26-36 and 27-37 of ring 40. Ribbon cable dip plug 57, not shown, connects between both MOSfet switch banks 48-49 and the dip socket 147 allowing high frequency drive function 146 access to MOSfet switch banks 48 and 49. Current from four five-turn secondary windings around the E-core 47 connect to dip socket 148 in power receiving function 149 through a ribbon cable not shown. Also in power receiver function 149 solder points 150 are provided on the controller board 50 to allow input from the auto-starter special transformer component 79 contained within the case 59. Incoming current passing through dip socket 148 powers isolated, regulated DC power supplies of isolated, regulated power supply function 151. Isolated regulated power supply function 151 consists of 4 isolated, regulated 12 volt power supplies providing power for the 50-60 Hertz pulse width modulator chip driving opto-isolator chips, not shown, to drive isolated non-inverted MOSfet divers in 50/60 Hertz driver function 145 for H-bridge 144. High frequency pulse width modulator chip in high frequency inverted driver function 146 drives inverted MOSfet driver chips also in 146 receiving power from isolated regulated power supply function 151. Current from the 40-turn secondary bifiler high frequency output leads 51, 52, 53, 54 connect to bridge rectifiers 152 and 153. One bifiler high frequency output lead set 51-52 attaches to bridge rectifier 152 at pin 154 and 155. The second 40 turn secondary bifiler high frequency output lead set connects to bridge rectifier 153 at pins 156 and 157. Pins 154, 155 and pins 156, 157 are high frequency AC 25 amp connections. High power output from the upconverter 45 totals 50 amps DC, and requires that high currents be transferred onto the printed circuit controller board 50. This is achieved using a 20 mil patterned copper sheet 158 placed over the corresponding regions on the controller board 50 during manufacture. Bridge rectifiers 152, 153 connect to source and drains of the MOSfet transistors of the H-bridge 144 using the patterned copper sheet 158. Also connected to the patterned copper sheet 158 are the power output connections to grid-equivalent receptacles 141a, 141b, 142, and DC receptacle 143. Receptacle 141a delivers 120 volt AC at 50/60 Hertz from one side of the H-bridge 144. Grid equivalent receptacle 141b delivers 120 volt AC at 50/60 Hertz from the other side of the H-bridge 144. Receptacle 142 delivers 240 volts AC at 50/60 Hertz from both sides of the H-bridge 144. DC receptacle 143 delivers 120/240 volt DC by connections to bridge rectifiers 152 and 153 through patterned copper sheet 158. DC receptacle 143 delivers 120 volt and 240 volt DC power from the thermoelectric generator device. Power from DC receptacle 143 can be regulated internal to the thermoelectric generator device or externally by any of the following topologies; buck, boost, buck-boost, sepic, fly back, forward, 2-switch forward, active clamp forward, half bridge, push pull, full bridge, phase shift ZVT, low drop out voltage regulator, and others. Also connecting to, the patterned copper sheet are electrical connections not shown that powers the internal blower motor 61 in thermoelectric generator devices 58, 74, and dual use thermoelectric, hybrid 159. Blower motor 61 operates with AC or DC voltages as required. In a preferred embodiment the grid equivalent receptacles 141a, 141b, 142, 143 are mounted on the case 59. In many applications utilizing a dedicated thermoelectric generator device the DC and AC outputs are connected directly to corresponding DC and AC motors.

FIG. 26 illustrates a dual power dual use semiconductor thermoelectric generator hybrid with heating and chilling functions of dual use thermoelectric hybrid 159. The dual power hybrid chiller device is a combination of thermoelectric generator device 58 of FIGS. 12 and 74 of FIG. 13 wherein both directly combusted fuel and hot air can be used to produce electricity in single unit dual use thermoelectric hybrid 159. By adding second controller board 160 and switch 161 it is possible to operate dual use thermoelectric hybrid 159 as a thermoelectric generator device or as a chiller or heater. This feature facilitates electric energy usage during the day while at night the chiller or heater function can be used. The chiller function can be use to collect water from the air. Case 59 houses components of the invention and is representative of the general form of a box to house components of the invention. Blower 60 powered by motor 61 forces air into the box, case 59 circulating around electronic components such as MOSfet switches 48 and 49, second controller board 160, controller board 50 and other components including cold fins 21 finally exiting distinct orifice 63. Legs 64 raise the case 59 to allow air to efficiently exhaust. Operating Mode-1 is a combustible fuel device wherein fuel enters venturi style distinct orifice inlet 66 past valve 179 operated by rotary solenoid 178 and is combusted above burner screen 68 and wherein combusted gas exits distinct orifice exhaust 162. Rotary solenoid 163 controls valve 164 allowing combustion gases to exit distinct orifice 162. When exit distinct orifice 162 is in use rotary solenoids 163, 178 and valve 164, 179 are in the open position for Mode-1. In Mode-2, where hot re-circulated air enters insulated distinctive orifice 165 through valve 167 operated by rotary solenoid 166 to allow hot air to pass across the hot fins 29 to exit distinct orifice 168 through valve 170 operated by rotary solenoid 169 allowing the hot air to return to a thermal store or other close-system recirculating source. In Mode-3 activating switch 161 activates second controller board 160, inactivates board 50, and thermoelectric generator device power functions cease. External electrical power enters electrical plug 171 to second controller board 160 that first rectifies incoming power into direct current. Second controller board 160 DC-to-DC switch-converts incoming power into high current low voltage to drive the secondary coil 46 now operating as a primary coil of the same upconverter 45. Electrical power from the plug 171 is DC-to-DC switch-converted down through the E-core 47 to circulate a large current through ring 40 dragging heat with the current from one set of fins to the alternate set of fins. MOSfet switch banks 48 and 49 are enabled by second controller board 160 to input switched and transformed high current DC to flow around ring 40 as to direction. DC current around 40 may be controlled in one direction or the other dependant on second controller board 160 for heating or cooling operating modes. When current flows one direction the hot fins 29 become cold and cold fin 21 becomes hot. Incoming air through distinct orifice tube 172 passes through valve 173 that is activated by rotary solenoid 174. Air or glycol mixture is chilled by passing over chilled fin 29 to exit distinct orifice tube 175 passing valve 176 actuated by rotary solenoid 177. Plug 69 contains combined temperate sensor 132 and a resistance-heated igniter 70 that is used in the combustion phase Mode-1 for ignition. All valves 176, 164, 170, 179 167; and 173 and rotary solenoids 177, 163, 169, 178, 166, and 174 are normally closed until operating Mode is selected with switch 161. Orifices 63, 65, 165, 172, 168, 162, and 175 are distinct orifices.

The device described in FIG. 26 can be manufactured to provide the cooling and heat when power is obtained from the grid. Thus for versatility in the use of both direct combustion and for recirculation of hot air from external heat sources a single thermoelectric generator device comprising the valves to shift between these different heat sources can be constructed based on the descriptions in FIGS. 12, 13 and 26.

Reduced barriers, high efficiency and high purity n-type and p-type semiconductors play an important role in allowing high-energy conversion efficiency. Example 1 gives the preferred range of element percentages by weight for n-type semi-conductor. Example 2 gives the preferred range and element percentages by weight for p-type semiconductor. The method of manufacture is described in detail above with regard to FIG. 1.

Example 1

Reduced Barriers N-Type Semiconductor Composition

| Element | Range | Preferred Amount |
|---|---|---|
| Selenium | 5% - 12% | 10% |
| Bismuth | 40% - 60% | 45% |
| Tellurium | remainder to 100% | 45% |

This n-type selenium-bismuth-telluride-based semiconductor composition represents a formula $[Bi_2Te_3]_{0.35}[Bi_2Se_3]_{0.65}$ approximating a ratio of one part dibismuth tritelluride and two parts dibismuthtriselenide. This product appears to be crystalline.

Example 2

Reduced Barriers P-Type Semiconductor Composition

Element Range Preferred Amount

| Antimony | 28% - 32% | 30% |
|---|---|---|
| Bismuth | 8% - 12% | 10% |
| Tellurium | remainder to 100% | 60% |

This p-type antimony-bismuth-telluride-based semiconductor composition represents a formula $[Bi_2Te_3]_{0.35}[Sb_2Te_3]_{0.65}$ or about one part dibismuthtritelluride and 2 parts diantimonytritelluride. Diantimonytritelluride structural form is a glass. The structure of dibismuth-tetraantimony-nonatelluride as produced by the method described herein appears to be crystalline.

Copper and some other elements greatly degrade performance of these semiconductors; therefore high purity elements are needed. Each chemical element should be at least 99.9% pure and preferably 99.999% pure.

Semiconductors are protected from infiltration of copper atoms and components of solder by first coating the wafer edges with a non-conductive high temperature-melting ink, brand named "mark-tex" high temp 44 manufactured by DYKEM, preferably color coded products that can reduce the chances of misplacing an n-type or p-type wafer in a coupon. After the wafer edges are passivated the wafer is cleaned by dipping it in a solution of one part of 35% HCl with 2 parts distilled water. After a dip of about 30 seconds the cleaned wafer is rinsed in deionized water and immediately placed in a hot nickel plating solution of phosphorus-nickel material. This plating solution when heated to 95 degrees C. provides an electroless method of plating. Furthermore, this method of plating allows co-precipitation of elemental phosphorous on the wafer sides. Phosphorous content ranges from 1% to 13%. Phosphorous reduces corrosion on both the hot fins and cold fins. Its hardness increases after heating. Wafers are removed from the plating solution after about 30 minutes. This procedure results in a thickness of nickel on the wafer sides ranging from 15 to 30 microns thick. The wafer edges of the semiconductor do not become plated because of the anodic oxide produced during anodic slicing and the non-conductive edge ink coating that protects it. Current leakage around the wafer edge can be on the order of 400 amps per wafer if nickel is allowed to plate the wafer edges.

In a preferred embodiment, after coating the wafer edge with the high temperature etch resistant material, and plating the wafer sides with nickel, wafers are then annealed by heating to a temperature of 250 degrees C. in a hydrogen atmosphere for more than 2 hours.

Copper is the metal of choice for hot and cold fins because of its high electrical and thermal conductivity. To reduce corrosion and prevent migration of copper into the semiconductors, fins are coated with metal more resistant to oxidation, preferably phosphorus nickel. In a preferred embodiment nickel is electroless-plated on the fins in the same manner and with the same benefits as plating the wafer sides.

A simple implementation of the invention uses fins that are tapered on the end that connect to the n-type and p-type semiconductors. Either the hot fin or the cold fin or both may be tapered. The degree of tapering in one or both fins equals that provided by a single wedge as described in a preferred embodiment. In lieu of tapered fins it is possible to assemble a ring of coupons without using a wedge by tapering either or both of the n-type and p-type wafers.

To allow the use of parallel wafer sides and uniform metal-semiconductor filling of the ring hot and cold fins are not tapered at the end connecting to the semiconductors, instead coated copper wedges are used uniformly around the ring. Preferably the copper wedges are coated with nickel and placed in registry with each coupon as detailed with respect to FIGS. 6, 7 and 8.

In another preferred embodiment hot fins are arranged perpendicular to cold fins and hot fins extent towards the center of the ring. The ends of the hot fins facing the center of the circle are tapered at the end extending to the center so as to reduce the likelihood of an electric short caused by fins touching and at the same time reduce the size of the center opening.

Electrical energy is extracted from the ring using an upconverter as described above in texts for FIGS. 6-11. The critical features of the upconverter are as follows:

Two cold fins are soldered in the ring to which insulated multi-layer copper strip laminates have been high-temperature brazed.

Brazing of wafers to fins and wedges is accomplished by diffusion of the pure silver powder addition into the tin-silver eutectic solder paste allowing wafer-to-fin bonding first by low temperature eutectic solder means at approximately 270 degrees C. Later a soldered connection is converted to a brazed connection that melts well above 340 degrees C. through heating during normal thermoelectric generator device operation. The conversion of soldered connections to brazed connections is dependent on the addition of at least 4% by weight of powdered silver to the Kester's solder.

Silver is the metal of choice for upconverter laminates and connecting cold fins because of its high electrical and thermal conductivity contributing significantly to thermoelectric generator device performance by lowering the combined resistance of the ring, upconverter, and switch bank series circuit.

Mica or similar heat stable insulating material is placed between 2 power takeoff cold fins with attached dual laminate takeoffs. One of these takeoffs is rotated physically 180 degrees so as to pass current around E-core in the opposite direction relative to the first.

The upconverter includes a high frequency E-core transformer which allows a 40 to 1 voltage increase between input from the ring and output voltage from the transforming upconverter. It also includes the use MOSfet switch banks, one for each single turn loop. The MOSfet switch banks are controlled by make-before-break controller board. The make-before-break feature is achieved by using inverted MOSfet drivers. The higher voltage AC is then rectified to DC after the transformer and then it is again converted to AC at the standard grid frequency, such 50 and 60 Hertz, in square waveform with pulse width modulation to control output equivalent RMS voltage. Sine wave output is possible using the H-bridge driven by a sine wave generator but this method leaves one third of the energy as heat in the H-bridge switches. Sine wave outputs require one third more fuel burned in the thermoelectric generator device or heat passed through the thermoelectric generator device than required for square wave outputs. Square wave output is satisfactory for most AC uses.

An essential feature of this invention is a make-before-break upconverter circuit. FIG. 24 compares the effect of inverted MOSfet output to non-inverted outputs. In the non-inverted output high frequency electromagnetic radiation is prevalent. This adversely affects other electrical and communication equipment. As illustrated, by inverting the drive to MOSfet switch banks current is maintained in the ring and E-core at all times.

Non-metallic thermo-stable plastic can be used in lieu of a metal band with electrical insulator to hold the ring-shaped thermoelectric generator device in compression.

Prior to assembly each coupon is tested for its thermoelectric activity. Voltage for a given temperature differential is measured separately for each semiconductor in the coupon and accepted if greater than 200 microvolts per degree C. for each. Conductivity of the entire coupon is accepted if resistance is less than 0.000014 Ohms as measured at room temperature.

During assembly of the ring silver-modified Kester's lead free solder paste is applied between each previously tested coupon, the upconverter power takeoff, and the shortened cold fin placed 180 degrees across from the power takeoff. The addition of at least 4% silver powder to the lead-free eutectic solder paste, that comprising 3.5% silver and 96.5% tin, allows the eventual conversion of a solder union to a brazed union. Kester's solder paste originally melts when heated to 270 degrees C. at a rate of 10 degrees per minute. Upon normal use of the thermoelectric generator device, the 4% silver powder diffuses into the eutectic solder changing its melting point to a new value above 340 degrees centigrade. This original soldered connection becomes a brazed connection over time. The elevated melting point reduces the chances of damage to the thermoelectric ring due to its being operated with too high a temperature differential between the hot fins and the cold fins.

After assembly and application of inward compression on the ring by an insulated metal band, resistance is measured in the ring and the ring is accepted if resistance is less than 0.001 Ohm. If higher resistance is found coupons are retested and any high resistance coupon is removed and replaced with low resistance one. The above process is repeated as needed until the un-bonded ring measures 0.001 Ohm. Upon passing the assembled resistance test the ring is then heated to solder components together. In a preferred embodiment the rate of heating is 10 degrees per minute to a temperature of 270 degrees C. After reaching 270 degrees C. the ring is removed from the heating source and allowed to air cool. In another preferred embodiment the cold fins are positioned downward so any excess solder drips along the cold fins creating extra surface area for heat exchange.

In another preferred embodiment the completed ring is tested again for electrical conduction by measuring the resistance of the ring at room temperature. Resistance of a completed ring should be less than 0.0014 Ohms. Should the soldered ring measure greater than 0.001 Ohm this particular ring would be used in the manufacture of a chiller that can tolerate greater resistance because of the availability of high externally applied voltage. In addition a soldered ring with a defective coupon can be used in a chiller application by conducting current around the defective coupon.

The assembled thermoelectric ring is tested by placing a 1,500-Watt electric heater adjacent to the hot fins while blowing air, across the cold fins and measuring the power output from the secondary of the upconverter attached to a 1,000 Watt load bank. The expected power output is 1,000-Watts. The final performance evaluation of the completed thermoelectric generator device is made by running a completed thermoelectric generator device at 5-kW electrical output with a flow rate of 1-lb of propane per hour. The overall efficiency should be greater than 50%.

In a preferred embodiment heat energy obtained from the sun using a solar collector is stored in solid particulate material, preferably porcelain fragments. The preferred solar collector is flat multi-faceted Fresnel planar mirror array as in FIGS. 15a, 15b and 15c. The details of construction and operation are discussed with regard to these FIGs. The size of the Fresnel solar collector is matched to the needs of the user. In a preferred embodiment heat is stored in insulated containers having an inlet from the solar collector at the bottom. Heat is transferred from the solar collector to a heat store by blowing air through insulated air-tight lines using a closed system blower. Separate insulated air lines take hot air from the store and circulate it in a closed fashion through the thermoelectric generator device. A heat sensor on the exit line of the thermoelectric generator device controls the rate of flow of air from storage using a proportional control valve or by changing blower speeds. A temperature of about 500 degrees C. is preferred exiting the thermoelectric generator device. A thermoelectric generator device can be operated with air circulating directly between thermoelectric generator device and solar collector.

Energy savings are made when immediate energy needs are lower than collected solar energy. Excess electrical energy produced from the conversion of solar energy to electrical energy in the thermoelectric generator device is stored in the porcelain fragments using a resistive heater. This process provides a spinning reserve for the electrical system. The process can also be used to inject high quality heat into a high quality heat store from low quality solar heating acquired early morning or late evening. When the amount of solar energy is lower than needed high quality heat from a high temperature heat store can be used to make up the difference.

Thus the combination of direct solar energy utilization together with a high temperature reserve makes use of much of the solar radiation available. Two-axis solar collector tracking makes 30% more heat available for storage over that of single axis tracking.

Table 3 lists the heat capacity of porcelain. The value $C_p$ extrapolated to 1025 degrees C. is 1.94 joule/gram/degrees K

TABLE 3

| Specific Heat | |
|---|---|
| Temperature (degrees C.) | Specific Heat |
| 25 | 0.787 |
| 100 | 0.893 |
| 200 | 0.990 |
| 1025 (extrapolated) | 1.94 |

In a preferred embodiment the heat storage system is fabricated from insulated, airtight stainless steel barrels with inlet-outlet distinct orifices so that heat energy containing air can be circulated through porcelain fragments that fill the barrels. The volume of each barrel is 7.4 ft³ and the fill factor is typically 80%. This fill factor allows air circulation through out the storage media. Four such heat-storing barrels contain crushed porcelain fragments with a specific heat between 1.2 and 1.5 J/gK and a density of 2.50. Neglecting the mass of the barrels the heat storage will be 2,100 kg for a stationary system. The heat storage capacity for this device is shown in the table 4 below in kW-hours of useful power:

TABLE 4

| Exemplary Storage Capacities | | | |
|---|---|---|---|
| Storage temperature (C.) | Mass (kg) | Cp (J/g · K) | kWh |
| 300 | 2,100 | 1.03 | 344 |
| 500 | 2,100 | 1.2 | 451 |
| 900 | 2,100 | 1.5 | 1,026 |

The calculation for heat energy stored in 2,100 kg of ceramic fragments at 900 C. is:

$$\text{Watt-hrs} = (1.5 \text{ J/g} \cdot \text{ K})(1 \text{ Watt-sec/J})(1{,}173\text{K})(2{,}100 \text{ kg})(1{,}000 \text{ g/kg})$$

$$(1 \text{ min}/60 \text{ sec})(1 \text{ hr}/60 \text{ min}) = 1{,}026{,}375 \text{ Watt-hrs, or } 1{,}026\text{-kW-hrs}$$

An example of operating the energy system for several Austin, Tex. days in 1990, with a 40 m², 20:1 parabolic collector, using 6 stainless steel barrels similar to those describe above for heat storage is shown in table 5.

TABLE 5

| Energy Balance Examples | | | |
|---|---|---|---|
| | July | September | December |
| 70% of Solar Radiation | +114-kWh/day | +73.6-kWh/day | +32-kWh/day |
| Balance from day before | +17-kWh/day | +17.3-kWh/day | +17-kWh/day |
| Daily Total: | +131-kWh/day | +91-kWh/day | +49-kWh/day |
| System Leakage | −2.25-kWh/day | −2.25-kWh/day | −2.25-kWh/day |
| Parasitic Load | −3.6 -kWh/day | −3.6-kWh/day | −3.6-kWh/day |
| Electric Generation | −36.0-kWh/day | −36.0-kWh/day | −36.0-kWh/day |

TABLE 5-continued

Energy Balance Examples

| | July | September | December |
|---|---|---|---|
| Heater/Chiller, 10 ton-hrs | −14.4-kWh/day | −14.4-kWh/day | −14.4-kWh/day |
| Total daily usage | −56.25-kWh/day | −56.25-kWh/day | −56.25-kWh/day |
| Balance: | +75-kWh/day | +34.8-kWh/day | −7.25-kWh/day |

The −7.25-kWh/day represents a daily energy deficiency.

The calculations in table 5 show that solar radiation can supply the average home most months of the year in southern US climates. There are several ways to cover this deficiency in the winter months. One is to conserve on electrical usage, 15 hours instead of 16; the other would be to burn some supplemental fuel. For instance, the −7.25-kWh/day could be made up by burning 1.5 lbs. of propane each day or 10.5 lbs. each week or 2.3 gal. Another way is to enlarge the size of the solar collector twenty percent.

Other types of solar collector can be employed to conveniently collect sun energy. Examples include but are not limited to parabolic dish on a gun mount, parabolic trough with center focus hot air closed loop pipe, two-axis tracking Fresnel lens, and two-axis tracking cone collector.

In another preferred embodiment power conversion efficiency is improved by circulating chilled water to the cold fins. This can be accomplished by adding an electrically driven refrigerator to cool water when excess electricity is available.

In another preferred embodiment a battery boost allows the system's micro-controller to shut off the thermoelectric generator device at night when loading is below a certain load level, only to restart the thermoelectric generator device when the batteries drain to a less than minimum preset safe level. The battery system can be charged with energy from the grid or with electrical energy from the thermoelectric generator device. By using the utility grid to charge the battery bank, the utility customer reduces the likelihood that the utility company will deny service or require minimum usage.

In this case should the thermoelectric generator system ever fail, the utility service can be used as if nothing happened, bringing in outside energy through the battery system. Thus, energy from the grid is provided through the battery system to improve the overall reliability of the system. On the other hand, should the utility system fail, the thermoelectric generator device can support a residence or commercial building as if no power failure had occurred, automatically and without disconnects or switchovers. Such a hybrid source of electricity provides the user with seven 9s reliability, up from the standard four 9s reliability realized with the grid only. To achieve this reliability it is important for the customer to remain connected to the grid where it is available.

The above described inventions and implementations illustrate the broad range of uses of the improved thermoelectric generator device and its chiller hybrid versions. In addition there are many other implementations and utilities which can make use of the valuable properties of these inventions that include efficiency, low noise and portability.

In a preferred embodiment a smaller version of the thermoelectric generator device described in detail herein is made to be a portable or backpack thermoelectric generator device. By providing 120-volt AC output the backpack can be used with any tool or device which would otherwise require proximity to an electric outlet or portable liquid-fuel stand-alone thermoelectric generator device.

In another preferred embodiment a thermoelectric generator device as illustrated and claimed herein is combined with the motor portion of a utility such as an electric tool producing a thermoelectric generator tool. Examples include but are not limited to a chainsaw, circular saw, reciprocating saw, drill, posthole digger, and automatic nail driver. The benefit of having a hybrid tool is to allow the energy demand of the tool to control the fuel consumption rate by direct feedback.

In a preferred embodiment the thermoelectric generator device claimed herein is combined with the motor component of a compressor with air storage vessel to provide a portable quiet and efficient air compressor system.

In another preferred embodiment a small thermoelectric generator device is fitted to replace batteries in battery powered utilities such as hand tool, especially those that use a common battery size and shape to power a variety of different kinds of tools. In this case the DC output connects directly to an adapter designed to fit in place of the rechargeable battery.

In addition to thermoelectric generator tools the thermoelectric generator device disclosed herein can replace other means of supplying energy to utilities such as appliances. Thus a thermoelectric generator device can be combined with a motor driven compressor used in common household refrigerators and freezers. Similarly an electric stove can be combined with a thermoelectric generator device so that the stove is powered by gas or liquid fuel while the cooking elements and controls are electric. Such appliances fitted to burn wood would be especially useful in remote areas where wood is abundant and electricity is not present. As with thermoelectric generator tools thermoelectric generator appliances have the benefit of allowing feedback to control the rate of combustion. In a preferred embodiment appliances combined with a thermoelectric generator device are designed to provide electricity through an electrical plug to the electric bus so as to power other non-hybrid appliances or components.

In addition to operating thermoelectric generator tools and appliances the invention can be used to operate electric vehicles on common fuels but also on solar heated hot air. One pound of aviation gasoline or jet fuel contains approximately 5.4-kW of heat energy per pound. To convert this fuel into electricity at an efficiency of 22%, the conversion would be 1.2-kW per pound. One pound of hot ceramic fragments, drawn down from 900 degrees C. to 300 degrees C., releases 0.15-kW. One pound of gasoline contains 8 times more energy than a pound of ceramic fragment used as a heat store. This is misleading, because when the total weight of each conversion mechanism is considered, the ceramic heat store system has a power to weight advantage.

The weigh of a gasoline combustion engine-generator for a stationary application is 300 to 500 lbs. As a transportation system the weight of a combustion engine drive-train can weigh 600 lbs. plus 20 gallons of gasoline (120 lbs.) for a total weight of 720 lbs. capable of 400 mi. range. Drive-train weight for a thermoelectric generator device and motor weigh only 80 lbs. and with 195 lbs. of ceramic heat store also has a range of 400 miles, for a total weight of 275 lbs. The combustion engine system weighs 2.6 times more than a heat-store-equipped automobile, both having a range of 400 miles between refuel and reheat. Examples of various forms of transportation conveyance are given in Table 6. The performance listed for "Auto-large" is the actual data derived from a 95 Lincoln Town Car converted to thermoelectric generator power using propane as fuel. This chart shows that thermoelectric generator powered conveyances using only stored solar heat can be operated to replace hydrocarbon-based fuels at the equivalent of $2.50 to $3.00 per gallon.

TABLE 6

Conveyance Performance with Solar Heating

| Vehicle Type | Heat Store kg | Power Average kWh | Speed Miles/ hour | Power kW | Range Miles |
|---|---|---|---|---|---|
| Auto-small | 175 | 57 | 70 | 5 | 800 |
| Auto-large | 352 | 114 | 70 | 20 | 400 |
| Bus | 615 | 200 | 30 | 50 | 200 |
| Light Rail | 1,154 | 375 | 40 | 50 | 300 |
| Long Haul Truck | 7,039 | 2,286 | 70 | 200 | 800 |
| 100 Unit Train | 123,467 | 40,000 | 50 | 4,000 | 500 |
| Ship & Tow Boat | 1,231,671 | 400,000 | 10 | 2000 | 2000 |
| Airplane -small | 1,540 | 500 | 200 | 200 | 500 |
| Airline Transport | 32,845 | 10,667 | 300 | 4,000 | 800 |

Thus having described the method of manufacture of components, the assembly of components, an efficient means to extract energy produced by a temperature differential, a means to improve the overall efficiency of converting heat to electricity by combining a thermoelectric generator device with a hybrid chiller and by having given a variety of examples as to how to combine said thermoelectric generator device with other components to provide a broad range of useful products,

We claim:

1. A high efficiency semiconductor thermoelectric generator device comprising:
   a. a thermoelectric generator component including a plurality of standard coupons soldered in registry and adapted for being held in compression in the form of a ring, each standard coupon including:
      i. an anodically sliced, reduced barriers, high purity, p-type, antimony-bismuth-telluride-based semiconductor wafer;
      ii. a first metallic fin adapted for being cooled;
      iii. an anodically sliced, reduced barriers, high purity, n-type, selenium-bismuth-telluride-based semi-conductor wafer; and
      iv. a second metallic fin adapted for being heated, wherein the order of standard coupon assembly is in consistent order:
         i. first cooled metallic fin;
         ii. n-type semiconductor wafer;
         iii. second heated metallic fin; and
         iv. p-type semiconductor wafer;
   b. an upconverter component with power takeoffs for removing electrical energy generated from high currents produced in said ring-shaped thermoelectric generator component when cooling is applied to said first cooled metallic fins and when heat is applied to said second heated metallic fins, said upconverter being incorporated into said ring-shaped thermoelectric generator component between standard coupons before soldering of said ring-shaped thermoelectric generator component, said upconverter including:
      i. a first modified coupon having one additional straight cooled fin on the opposite end of a standard coupon from said cooled fin thereof and having a first complementary pair of power takeoff metal laminates fixed thereto, and
      ii. a second modified coupon:
         A. that lacks a cooled fin and adjacent n-type semiconductor wafer of a standard coupon;
         B. including instead a straight cooled fin that replaces the n-type semiconductor wafer of a standard coupon, and that is soldered to the heated fin of the second modified coupon, the straight cooled fin having a second complementary pair of power takeoff metal laminates fixed thereto; and
         C. an n-type semiconductor wafer soldered to the straight cooled fin on a side thereof furthest from the immediately adjacent heated fin,
      wherein said power takeoff metal laminates of said first and second modified coupons have one metal laminate of each pair twisted one-hundred eighty degrees (180°) relative to the other metal laminate, and wherein all of said metal laminates are insulated on the exterior and between metal laminates except at the ends thereof furthest from said ring-shaped thermoelectric generator component;
      iii. an insulator inserted between said first and said second modified coupons before final assembly of said ring-shaped thermoelectric generator component;
      iv. MOSfet switch banks respectively soldered between ends of power takeoff metal laminates of said first complementary pair and said second complementary pair thereby establishing:
         A. one twisted single turn closed loop; and
         B. one non-twisted single turn closed loop; and
      v. a transformer that includes:
         A. an E-core that is encircled both by the twisted single turn closed loop and by the non-twisted single turn closed loop that constitute primary windings of said transformer;
         B. several few turn secondary windings; and
         C. at least two high multiple-turn secondary windings;
   c. a controller component deriving operating energy after start up from one of said low multiple of secondary windings in said E-core transformer and wherein said controller component drives said MOSfet switch banks utilizing pulse width modulation to produce high frequency switching of said single turn loops by supplying inverted wavforms to said MOSfet switch banks thereby producing a make-before-break switching format;
   d. a DC to DC converter component wherein said two high multiple-turn secondary windings in said E-core transformer are rectified to produce DC current; and
   e. means for holding said coupons in fixed physical relationship to one another whereby said ring-shaped thermoelectric generator component becomes contiguous.

2. A device according to claim 1 further comprising a DC to AC converter component.

3. A device according to claim 2 further comprising direct wiring for providing electrical energy output from the thermoelectric generator device when heated fins are heated and cooled fins are cooled.

4. A device according to claim 2 further comprising at least one receptacle adapted for receiving at least one electrical plug for providing electrical energy output from the thermoelectric generator device when heated fins are heated and cooled fins are cooled.

5. A device according to claim 2 further comprising an electric blower to blow air around electronic components of said device, said electric blower being selected from a group consisting of:
   a. a DC blower that derives electrical energy from the output of said DC to DC converter component; and
   b. an AC blower that derives operating electrical energy from the output of said DC to AC converter.

6. A device according to claim 5 further comprising:
   a. a means for initially powering up said controller component;

b. a heated fins bowl container component enclosing said heated fins; and c. means for:
   i. heating said heated fins; and
   ii. cooling said cooled fins, and wherein:

a. said means to hold coupons in a fixed physical relationship includes a closed box with a distinct orifice to allow entry of air to cool electronic components;

b. said electric blower is attached to one side adjacent to said orifice;

c. electronic components including said controller component and said DC to DC converter component are attached to said box in close proximity to the output of said blower thereby allowing forced air to pass over them from the output of said blower in an amount of at least 10% of the pressure generated by said blower and in addition said closed box includes a distinct orifice in the bottom that provides an exit for air from said electric blower;

d. said heated fins bowl container component enclosing said heated fins is attached to said box;

e. said means to initially power up said controller component is attached to said box; and f. said means for heating said heated fins is accomplished by providing a distinct orifice in said box for inflow of hot air, a source of heat for heating said heated fins being selected from a group consisting of:
   i. an external heat source; and
   ii. a fuel and air mixture that burns inside said heated fins bowl container component.

7. A device according to claim 6:

a. wherein at least one of said fins included in standard coupons is tapered on the end thereof that is soldered to an adjacent semiconductor wafer thereby accommodating said contiguous ring-shaped thermoelectric generator component of coupons when held in compression;

b. wherein said power takeoffs of said upconverter are soldered between any two adjacent coupons in lieu of being soldered to modified cooled fins; and c. wherein said insulator is placed between said complementary power takeoffs.

8. A device according to claim 6:

a. wherein at least one of said semiconductor wafers of said standard coupon is tapered;

b. wherein said wafers are placed in said standard coupon with the narrow end of the taper toward the center of said ring-shaped thermoelectric generator component thereby accommodating said contiguous ring-shaped thermoelectric generator component of coupons;

c. wherein said power takeoffs of said upconverter are soldered between any two adjacent coupons in lieu of being soldered to modified cooled fins; and d. wherein said insulator is placed between said complementary power takeoffs.

9. A device according to claim 6:

a. wherein said blower and said ring-shaped thermoelectric generator component are so arranged in said box thereby allowing said output of said blower to cool said cooled fins; and b. wherein the amount of air pressure from said blower output to said cooled fins is at least 30% of the pressure produced by said blower.

10. A device according to claim 6:

a. wherein said anodically sliced, reduced barriers, high purity, n-type semiconductor wafer is made of:
   i. high purity selenium in an amount of from 5% to 12% by weight;
   ii. high purity bismuth in an amount of 40% to 60% by weight; and
   iii. the remainder being high purity tellurium;

b. wherein said reduced barriers, high purity, n-type semiconductor wafer is:
   i. anodically sliced to a thickness of about 40 mils from a seed-crystal-initiated slow-cooled boule casting;
   ii. then wafer-edge coated with non-conductive polymer;
   iii. then washed in dilute hydrochloric acid to remove anodic oxide;
   iv. then rinsed in deionized water;
   v. then hot phosphorous-nickel plated; and
   vi. finally annealed with hydrogen gas at about two-hundred fifty degrees centigrade (250° C.) for at least two (2) hours;

C. wherein said anodically sliced, reduced barriers, high purity, p-type semiconductor wafer is made of:
   i. high purity antimony 28% to 32% by weight;
   ii. high purity bismuth 8% to 12% by weight; and
   iii. the reminder being high purity tellurium; and D. wherein said reduced barriers, high purity, p-type semiconductor wafer is:
   i. anodically sliced to a thickness of about 40 mils from a seed-crystal-initiated slow-cooled boule casting;
   ii then wafer-edge coated with non-conductive polymer;
   iii. then washed in dilute hydrochloric acid;
   iv. then rinsed in deionized water;
   v. then phosphorous-nickel plated; and
   vi finally annealed with hydrogen gas at about two-hundred fifty degrees centigrade (250° C.) for at least two (2) hours.

11. A device according to claim 10 wherein said reduced barriers n-type semiconductor is made of a uniform mixture of one part dibismuth tritelluride and two parts dibismuthtriselenide.

12. A device according to claim 10 wherein said reduced barriers p-type semiconductor is made of uniform mixture of one part dibismuthtritelluride and 2 parts diantimonytritelluride.

13. A device according to claim 10:

a. wherein solder used in electrically connecting components of said ring-shaped thermoelectric generator component is Kester's lead-free, including 3.5% silver and 96.5% tin containing at least an additional 4% silver powder, said solder being applied to thickness of between 50 to 100 microns; and b. wherein said ring-shaped thermoelectric generator component is assembled and bonded by:
   i. heating to two-hundred seventy degrees centigrade (270° C.) at a heating rate of ten degrees centigrade (10° C.) per minute; and
   ii. then allowed to cool.

14. A device according to claim 10 wherein said coupons of said ring-shaped thermoelectric generator component are held in compression by a high tensile strength metal strap less than 5 mm thick tightened with 2 diesel spring tensioned clamps and insulated from said ring using polyimide tape.

15. A device according to claim 10:

a. wherein said heated fins and said cooled fins are arranged at an angle between forty-five degrees (45°) and two-hundred twenty-five degrees (225°) relative to one another; and b. wherein said ring-shaped thermoelectric generator component during soldering thereof is:

i. heated to approximately two-hundred seventy degrees centigrade (270° C.)
   A. at a heating rate of ten degrees centigrade (10° C.) per minute; and
   B. with said cooled fins being oriented downward; and
ii. then allowed to cool.

16. A device according to claim 15 further comprising a non-combustible plug with temperature sensor that:
   i. rests upon said heated fins; and
   ii. covers the center region of said ring-shaped thermoelectric generator component that is surrounded by said heated fins.

17. A device according to claim 15 further comprising a non-combustible plug that includes an igniter, said non-combustible plug:
   i. resting upon said heated fins; and
   ii. covering the center region of said ring-shaped thermoelectric generator component that is surrounded by said heated fins.

18. A device according to claim 15 wherein:
   a. said heated fins project inward toward a center of said ring-shaped thermoelectric generator component at an angle of ninety degrees (90°) relative to the cooled fins; and
   b. the cooled fins project perpendicular to the plane of the ring-shaped thermoelectric generator component.

19. A device according to claim 18 further comprising a non-combustible plug that includes a temperature sensor, said non-combustible plug:
   i. resting upon said heated fins; and
   ii. covering the center region of said ring-shaped thermoelectric generator component that is surrounded by said heated fins.

20. A device according to claim 18 further comprising a non-combustible plug that includes a resistance-heated igniter, said non-combustible plug:
   i. resting upon said heated fins; and
   ii. covering the center region of said ring-shaped thermoelectric generator component that is surrounded by said heated fins.

21. A device according to claim 10 wherein said cooled fins are cooled by blown air.

22. A device according to claim 10 wherein said cooled fins are cooled by pumping cold fluid over said cooled fins.

23. A device according to claim 10:
   a. wherein said heated fins bowl container component enclosing said heated fins is:
      i. a lower bowl with distinct orifice secured below said heated fins;
      ii. an upper bowl with distinct orifice secured above said heated fins; and
      iii. exterior insulation secured above said upper bowl as well as below said lower bowl; and
   b. wherein said upper bowl and said lower bowl are secured to and electrically insulated from the outside of said ring-shaped thermoelectric generator component.

24. A device according to claim 23 wherein said heated fins are heated by blowing hot air into said insulated lower bowl through said orifice of said lower bowl.

25. A device according to claim 24 wherein hot air flows through:
   a. said distinct orifice of said lower bowl;
   b. said distinct orifice of said upper bowl;
   c. through a conduit to said external heat source; and
   d. from said external heat source through a conduit back to said distinct orifice of said lower bowl.

26. A device according to 25 wherein said external heat source is a steam to air heat exchanger.

27. A device according to claim 10 wherein said metallic heated fins and said metallic cooled fins are made of copper and coated with phosphorus nickel having thickness between fifty (50) and one-hundred (100) microns.

28. A device according to claim 10 wherein a battery energizes operation of said controller component during startup.

29. A device according to claim 10 wherein operation of said controller component during startup is energized by a power conversion system that includes two high current oscillator circuits:
   a. whose operation is energized by power from each side of one of said MOSfet switch banks;
   b. both oscillator circuits transforming high current low voltage energy received from said ring-shaped thermoelectric generator component into a DC output voltage; and
   c. the DC output voltages produced by the pair of oscillator circuits being connected in series for providing 12 volt 100 milliamp regulated power to said controller component for initially energizing operation thereof.

30. A device according to claim 10 wherein at least one of said cooled fins has increased surface area due to shearing and bending in alternative directions that portion of said cooled fin not in contact with said semiconductor wafer.

31. A device according to claim 10 that is included in an electrically driven conveyance wherein the thermoelectric generator device energizes operation of one or more motors of said conveyance.

32. The conveyance of claim 31 wherein said conveyance is a land conveyance.

33. A device according to claim 10 that is included in an electrically powered utility that includes one or more motors, wherein the thermoelectric generator device energizes operation of the utility.

34. The electrically powered utility of claim 33 wherein said utility is a tool.

35. The electrically powered utility of claim 33 wherein said utility is an appliance.

36. A device according to claim 23 further comprising:
   a. a chiller control component;
   b. a switch for:
      i. inactivating said thermoelectric generator controller component; and concurrently
      ii. activating said chiller control component;
   c. wherein said distinct orifice of said lower bowl includes at least:
      i. one valved heat input orifice having a heating valve coupled thereto; and
      ii. one valved cooling input orifice having a cooling valve coupled thereto;
   d. wherein said distinct orifice of said upper bowl includes at least:
      i. one valved heat exhaust orifice having a heating valve coupled thereto; and
      ii. one valved cooling exhaust orifice having a cooling valve coupled thereto;
   e. wherein said chiller control component when activated:
      i. opens said cooling valves; and
      ii. closes said heating valves; and
      iii. supplies electrical energy to said ring-shaped thermoelectric generator component through said multi-turn winding.

37. A device according to claim 36 further comprising:
   a. a means to select one of at least two heat sources;

b. an additional valved heat input orifice included in said lower bowl; and
c. an additional corresponding valved heat exhaust orifice, a first pair of heat input and exhaust orifices respectively exchanging hot air blown through said external heat source, said external heat source being selected from a group consisting of:
a. heat storage chamber; and
b. a closed conduit heated by external combustion, and a second pair of heat input and output orifices which respectively receive fuel combustion products, and exhaust fuel combustion products away from said device.

38. A device according to claim 1 wherein coupons of said ring-shaped thermoelectric generator component further include a tapered metallic wedge soldered to a side of said p-type semiconductor wafer furthest from said second heated metallic fin to thereby accommodate said contiguous ring-shaped thermoelectric generator component of coupons when held in compression.

39. A device according to claim 6 wherein coupons of said ring-shaped thermoelectric generator component further include a tapered metallic wedge soldered to a side of said p-type semiconductor wafer furthest from said second heated metallic fin to thereby accommodate said contiguous ring-shaped thermoelectric generator component of coupons when held in compression.

* * * * *